(12) United States Patent
Darbari

(10) Patent No.: US 9,563,727 B2
(45) Date of Patent: Feb. 7, 2017

(54) CLOCK VERIFICATION

(71) Applicant: Imagination Technologies Limited, Kings Langley (GB)

(72) Inventor: Ashish Darbari, Abbots Langley (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 14/674,555

(22) Filed: Mar. 31, 2015

(65) Prior Publication Data

US 2015/0278416 A1    Oct. 1, 2015

(30) Foreign Application Priority Data

Mar. 31, 2014   (GB) .................................. 1405740.0

(51) Int. Cl.
  *G06F 17/50*    (2006.01)
  *G01R 31/317*   (2006.01)
(52) U.S. Cl.
  CPC ..... *G06F 17/5031* (2013.01); *G01R 31/31727* (2013.01); *G06F 17/504* (2013.01)
(58) Field of Classification Search
  CPC .............. G06F 17/5031; G06F 17/5045; G06F 2217/62; G06F 2217/84; G06F 11/26; G06F 1/10

USPC .......................................... 716/108, 113, 134
See application file for complete search history.

(56) References Cited

U.S. PATENT DOCUMENTS

| 5,581,699 A | 12/1996 | Casal et al. |
| 6,172,537 B1* | 1/2001 | Kanou ...................... G06F 1/10 327/149 |
| 7,930,609 B2* | 4/2011 | Inagawa ............. G06F 17/5031 703/1 |
| 2004/0221208 A1 | 11/2004 | Floyd et al. |
| 2008/0313589 A1* | 12/2008 | Maixner ............. G06F 17/5027 716/113 |
| 2009/0077440 A1* | 3/2009 | Inagawa ............. G06F 17/5031 714/735 |
| 2012/0209583 A1 | 8/2012 | Parizy et al. |
| 2015/0161315 A1* | 6/2015 | Meil ................... G06F 17/5031 716/108 |

\* cited by examiner

*Primary Examiner* — Nghia Doan
(74) *Attorney, Agent, or Firm* — Vorys, Sater, Seymour and Pease LLP; Vincent M DeLuca

(57) ABSTRACT

Methods and systems for verifying a derived clock using assertion-based verification. The method comprises counting the number of full or half cycles of a fast clock that occur between the rising edge and the falling edge of a slow clock (i.e. during the ON phase of the slow clock); counting the number of full or half cycles of the fast clock that occur between the falling edge and the rising edge of the slow clock (i.e. during the OFF phase of the slow clock); and verifying the counts using assertion-based verification.

18 Claims, 13 Drawing Sheets

CLOCK VERIFICATION

BACKGROUND

A System-on-Chip (SoC) typically comprises tens of clocks derived from one or more main or reference clocks. Each of the derived clocks has to be verified to ensure it has the correct time period and duty cycle with respect to the main or reference clock.

Such clock verification is typically done using dynamic simulation based checkers/monitors. However, such a verification method takes several simulation cycles and test vectors to validate each reference clock-derived clock pair. Furthermore, building the checkers/monitors is a tedious process which takes significant time and is prone to human error.

Such a verification method is also not easily adaptable to last minute changes to the configuration of any of the derived clocks. In particular, while it may be easy to re-wire the clocks to meet new requirements, re-validating such a change requires re-testing the new design with a new set of test vectors and simulations which is not only practically difficult, but can cause a significant delay to the delivery of the final product and may reduce the quality of the verification.

The embodiments described below are provided by way of example only and are not limiting of implementations which solve any or all of the disadvantages of known verification systems.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Described herein are methods and systems for verifying a derived clock using assertion-based verification. The method comprises counting the number of full or half cycles of a fast clock that occur between the rising edge and the falling edge of a slow clock (i.e. during the ON phase of the slow clock); counting the number of full or half cycles of the fast clock that occur between the falling edge and the rising edge of the slow clock (i.e. during the OFF phase of the slow clock); and verifying the counts using assertion-based verification.

A first aspect provides a method of verifying a derived clock, the method comprising: counting, using at least one first state machine, a number of full or half cycles of a first clock signal that occur between a rising edge and a falling edge of a second clock signal, the second clock signal operating at a lower frequency than the first clock signal; counting, using at least one second state machine, a number of full or half cycles of the first clock signal that occur between a falling edge and a rising edge of the second clock signal; and verifying the counts using one or more assertions written in an assertion-based language.

A second aspect provides a verification system to verify a derived clock comprising: at least one first state machine configured to count a number of full or half cycles of a first clock signal that occur between a rising edge and a falling edge of a second clock signal, the second clock signal operating at a lower frequency than the first clock signal; at least one second state machine configured to count a number of full or half cycles of the first clock signal that occur between a falling edge and a rising edge of the second clock signal; and an assertion verification unit configured to verify the counts using one or more assertions written in an assertion-based language.

A third aspect provides a non-transitory computer readable storage medium having stored thereon computer readable instructions that, when executed at a computer system for generating a representation of a digital circuit from definitions of circuit elements and data defining rules for combining those circuit elements, cause the computer system to generate the verification system of the second aspect.

A fourth aspect provides a non-transitory computer readable storage medium having stored thereon computer executable program code that when executed causes at least one processor to: count a number of full or half cycles of a first clock signal that occur between a rising edge and a falling edge of a second clock signal, the second clock signal operating at a lower frequency than the first clock signal; count a number of full or half cycles of the first clock signal that occur between a falling edge and a rising edge of the second clock signal; and, verify the counts using one or more assertions written in an assertion-based language.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

This acknowledges that firmware and software can be separately used and valuable. It is intended to encompass software as embodied in a non-transitory computer readable storage medium, which runs on or controls "dumb" or standard hardware, to carry out the desired functions. It is also intended to encompass software as embodied in a non-transitory computer readable storage medium, which "describes" or defines the configuration of hardware, such as HDL (hardware description language) software, as is used for designing silicon chips, or for configuring universal programmable chips, to carry out desired functions.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

Figure 1:
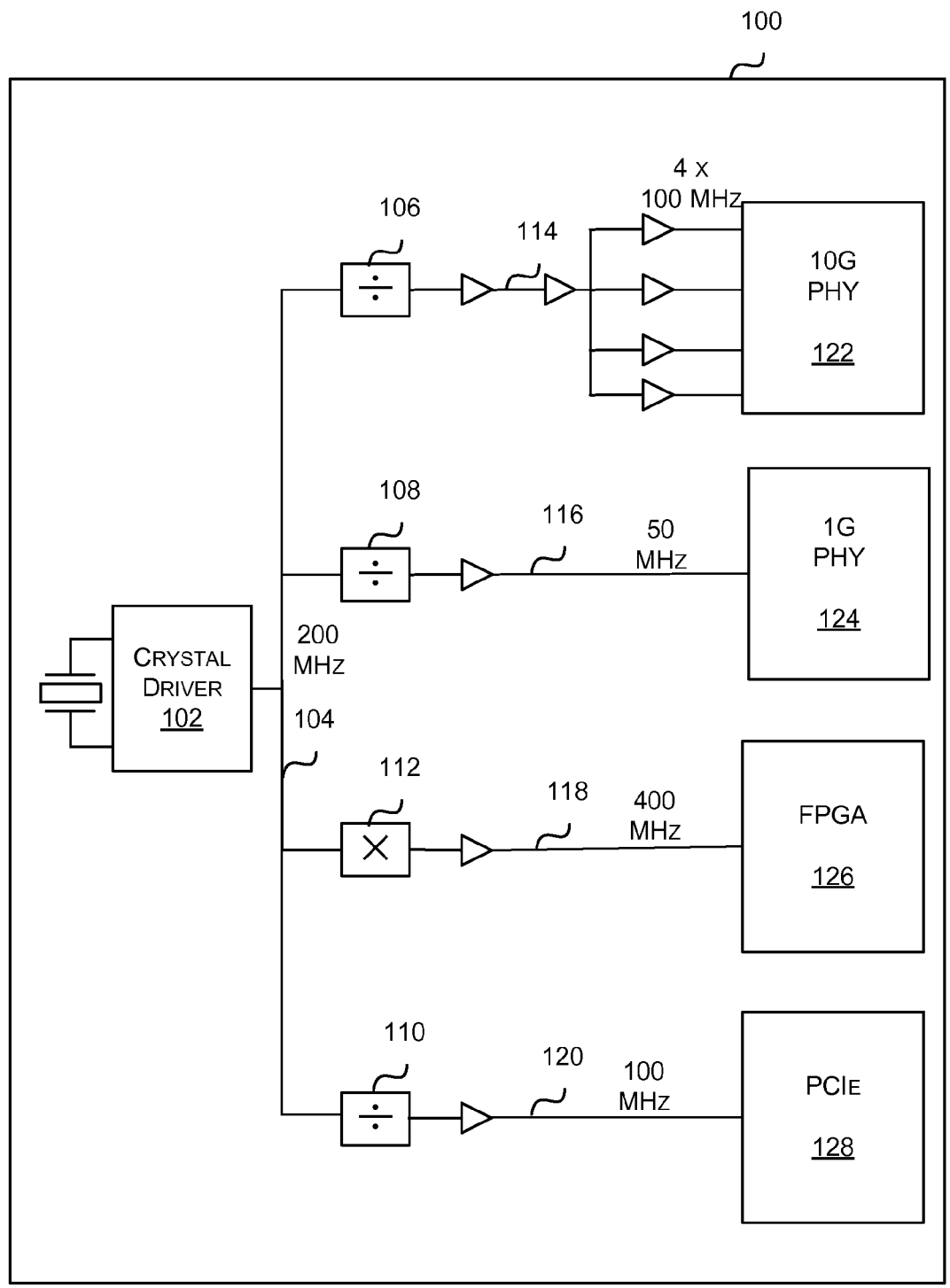
FIG. 1 is a block diagram of an example system on chip.

Common reference numerals are used throughout the figures to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Embodiments described herein relate to methods and systems for verifying a derived clock in a hardware design using assertion-based verification (ABV). Typically a hardware design (including the operation of a derived clock) is verified using simulation-based verification (described below with reference to FIG. 3) which involves applying input stimuli to the design implementation and comparing the output to a known or reference output. As described above, simulation-based verification requires the generation of the input stimuli which is time consuming, not easily adaptable and does not provide an exhaustive answer as to whether the design meets the specification (i.e. it is limited by the input stimuli). In contrast, ABV involves defining the properties to be verified mathematically using assertions and analyzing the state space of the design implementation to determine if the properties (e.g. assertions) are satisfied. This allows verification to be done without generating input stimuli. It also allows the design behavior (e.g. derived clock behavior) to be proved or disproved for all possible states. Assertions are also easily adaptable for different types of clocks and last minute changes to clocks.

As described above, a System-on-Chip (SoC) typically comprises tens of clocks derived from one or more main or reference clocks. For example, FIG. 1 illustrates an example SoC 100 that comprises a crystal driver 102 that generates a main or reference clock signal 104. The main or reference clock signal 104 is provided to a plurality of clock dividers 106, 108, 110 and a clock multiplier 112 each of which produce a derived clock signal 114, 116, 118, 120. As is known to those of skill in the art a clock divider, also referred to as a frequency divider, takes an input clock signal and produces an output clock signal with a frequency that is a fraction (e.g. 1/n where n is an integer) of the frequency of the input clock signal. In contrast, a clock multiplier takes an input clock signal and produces an output clock signal with a frequency that is a multiple (e.g. n where n is an integer) of the frequency of the input clock signal.

Each derived clock signal 114, 116, 118, 120 is provided to one or more design blocks 122, 124, 126, 128 of the SoC 100. For example, in the SoC 100 of FIG. 1, the first derived clock signal 114 is provided to a 10G physical layer device 122, the second derived clock signal 116 is provided to a 1G physical layer device 124, the third derived clock signal 118 is provided to an FPGA (field programmable gate array) 126, and the fourth derived clock signal 120 is provided to a PCIE (Peripheral Component Interconnect Express) 128. It will be evident to a person of skill in the art that the SoC 100 of FIG. 1 is exemplary only and other SoCs may have a different number of clock dividers and/or clock multipliers, a different number of design blocks, and/or different types of design blocks.

Before a SoC 100 is implemented in silicon the SoC design is verified. This includes verifying each derived clock signal to confirm it is operating correctly. Verifying a derived clock signal may comprise verifying that the derived clock signal has the correct period and duty cycle with respect to its reference clock signal.

In particular, a clock signal is defined by its period and duty cycle. The period of the clock is defined as the time it takes for a clock signal to repeat. This is illustrated in FIG. 2 where a first clock signal 202 has a period of two seconds, a second clock signal 204 has a period of eight seconds, and third and fourth clock signals 206 and 208 have a period of five seconds.

When a clock signal is "high" the clock is said to be in an ON state or phase 210, 212, 214, 216, 218 and when the clock signal is "low" the clock is said to be in an OFF state or phase 220, 222, 224, 226, 228. One ON phase and one OFF phase constitutes one cycle of the clock 202, 204, 206, 208. The period of the clock is the duration of a cycle.

A clock's duty cycle is the ratio of the ON phase to its period $$\left(\text{i.e. } \frac{duration\, of\, on\, phase}{period}\right).$$

Figure 2:
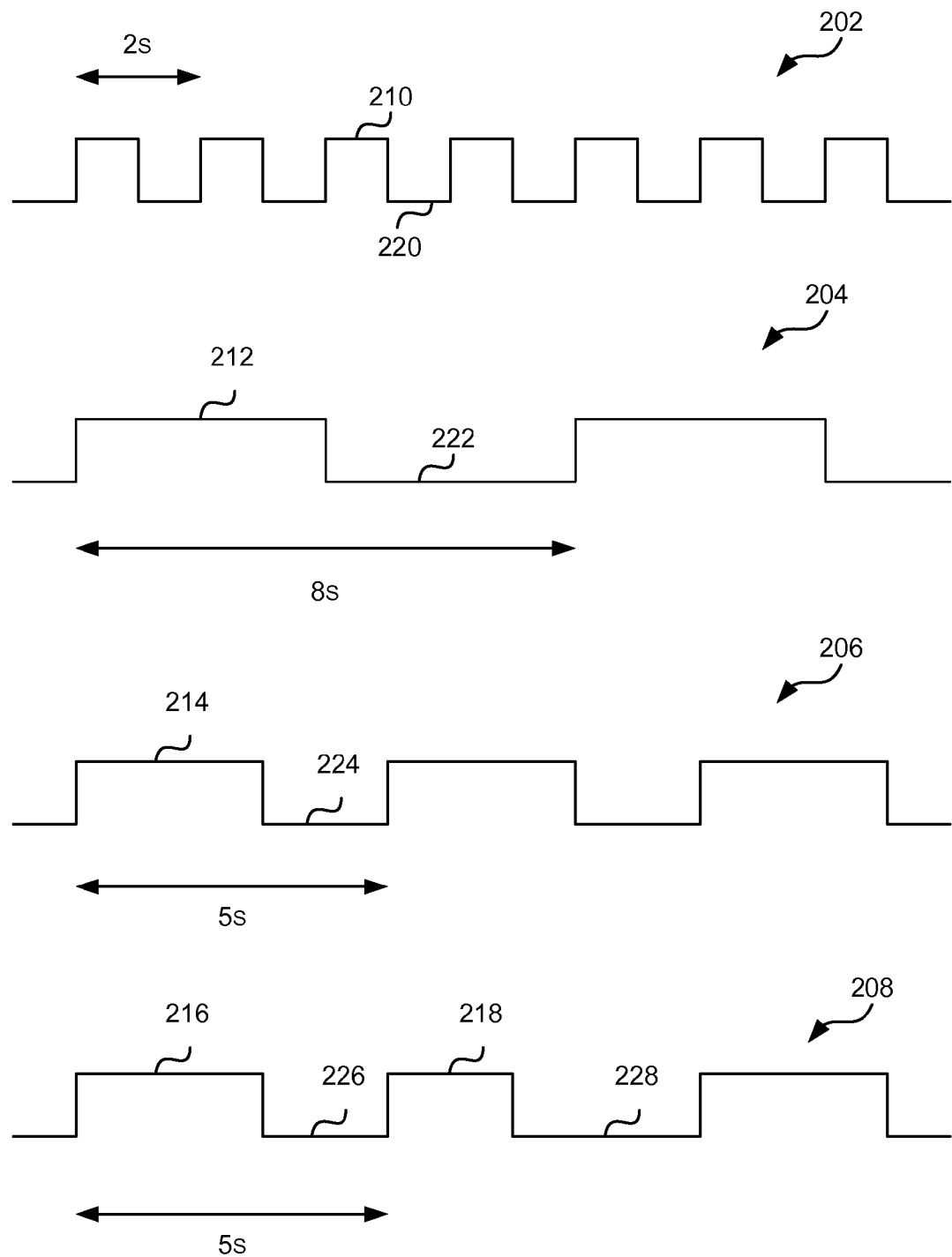
FIG. 2 is a timing diagram of some example clock signals.

In FIG. 2, the first two clock signals 202, 204 have ON and OFF phases of equal duration thus they both have a 50% duty cycle $$\left(\text{i.e. } \frac{1\ second}{2\ seconds}; \frac{4\ seconds}{8\ seconds}\right).$$

The third clock signal 206 of FIG. 2 has ON and OFF phases 214 and 224 of unequal duration which produces a 60% duty cycle (3 seconds/5 seconds). While the first, second and third clock signals 202, 204 and 206 of FIG. 2 have a constant duty cycle (i.e. the duty cycle does not change over time) other clocks may have a duty cycle that changes over time. For example, the fourth clock signal 208 alternates between a 60% duty cycle $$\left(\text{ON phase 216 and OFF phase 226} = > \frac{3 \text{ seconds}}{5 \text{ seconds}}\right)$$

and a 40% duty cycle $$\left(\text{ON phase 218 and OFF phase 228} = > \frac{2 \text{ seconds}}{5 \text{ seconds}}\right).$$

As is known to those of skill in the art there are several methods for verifying a hardware design (or parts thereof) including simulation based verification (also referred to as dynamic verification) and formal verification. The main difference between simulation based verification and formal verification is that simulation based verification is input-based (e.g. the test engineer supplies the test input signals) and formal verification is output-based (e.g. the test engineer provides the output properties to be verified).

Figure 3:
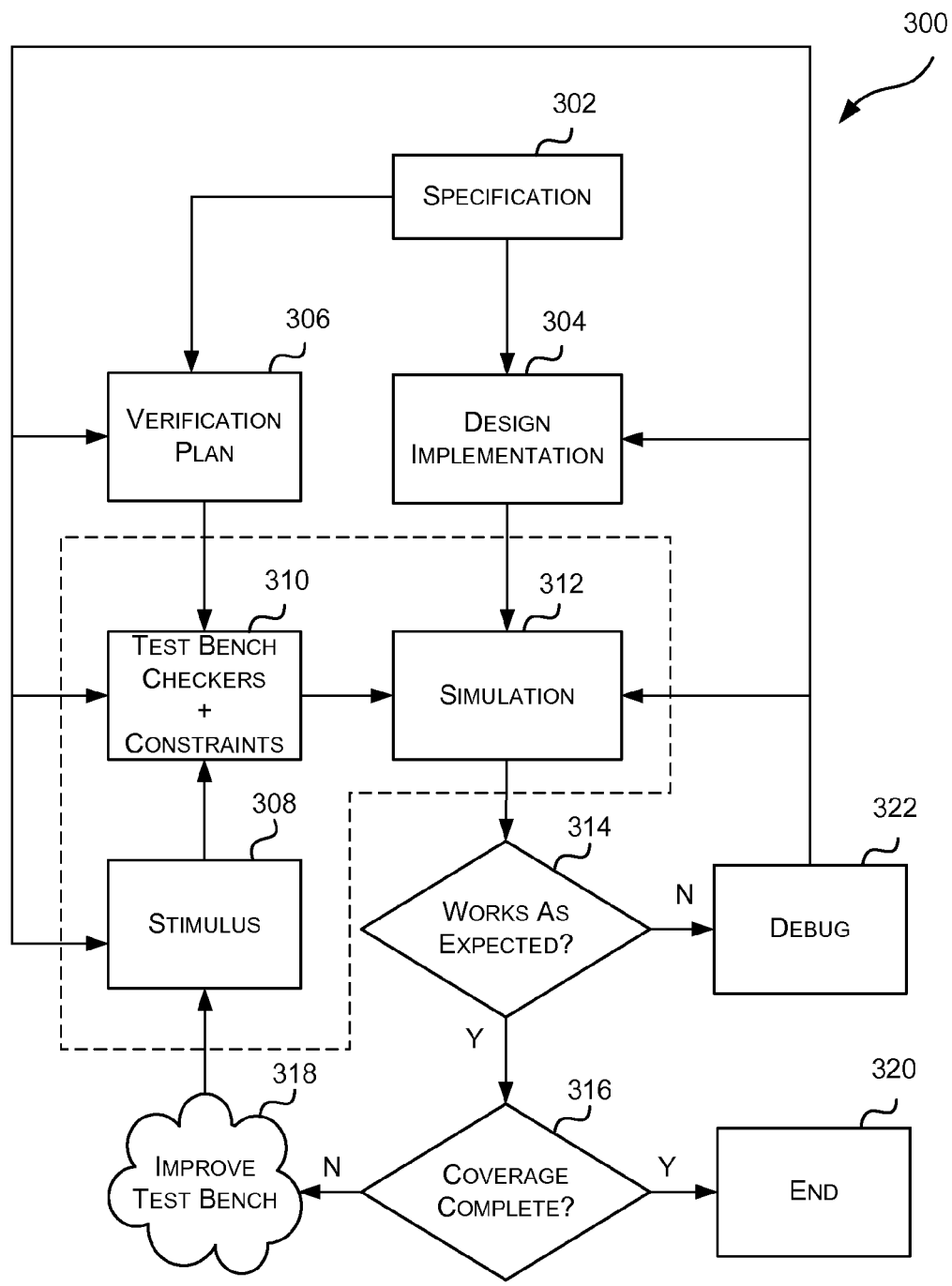
FIG. 3 is a flow diagram of a method of simulation based verification of a hardware design.

Simulation based verification is the most commonly used verification method. Reference is made to FIG. 3 which illustrates a method 300 for implementing simulation based verification.

During simulation based verification a design specification (e.g. desired circuit behavior) 302 is implemented in a high level hardware description language (HDL), such as, but not limited to a register transfer language (RTL) 304. Examples of register transfer languages include, but are not limited to, VHDL (VHSIC Hardware Description Language) and Verilog. It will be evident to a person of skill in the art that other high level languages may be used such as proprietary high level languages. The implementation is referred to as the design under test (DUT). It will be also understood by those of skill in the art that hardware manufacturing processes for manufacturing integrated circuits such as Systems-on-Chip from such a design specification have been well known in the art for many years. As is well-known, modern day integrated circuit (IC) design is split up into stages including circuit design using HDLs, verification of the circuit design (which is the subject of the present invention), and physical design wherein circuit representations of the components of the circuit design are converted into geometric representations that when manufactured in corresponding layers of semiconductor materials will provide the required functioning of the components. The next step after physical design is the manufacturing fabrication process wherein the designs are implemented onto silicon dies which are then packaged into ICs.

The specification (e.g. desired circuit behavior) 302 is also used to generate a verification plan 306. The verification plan details the specific functionality to be verified. A verification plan may comprise features, operations, corner cases, transactions etc., so that the completion of verifying them constitutes verification of the specification 302.

The verification plan 306 is then used to generate a test bench. As is known to those of skill in the art the test bench comprises stimulus 308 and test bench checkers and constraints 310. The test bench applies the stimulus 308 to the DUT 304 during simulation 312 and then captures the output. The test bench checkers 310 are then used to determine if the DUT is working as expected 314. In some cases the test bench checkers 310 may be configured to compare the output of the DUT to a known or reference output.

If the DUT is acting as expected, then the method 300 proceeds to block 316 where the coverage of the simulation is checked. In particular, the quality of the simulation is measured by the percentage of the design code that is stimulated and verified (referred to herein as the coverage metric). Accordingly, at block 316 the system receives feedback from the simulation 312 and determines the coverage metric and compares this to a coverage specification which details the required amount of coverage. If the coverage metric is less than specified in the coverage specification then the test bench, including stimulus and test bench checkers, are modified 318 to increase the coverage (e.g. by adding stimulation to parts of the design that have not been tested). If the coverage metric is equal to or greater than that specified in the coverage specification then the verification ends 320.

If the DUT is not acting as expected (e.g. the simulation output does not match the design output), then the method proceeds to a debug stage 322 where the source of the error/bug is identified. Once the bugs have been identified this information may be used to update or alter one or more of the design implementation 304, simulation 312, verification plan 306, test bench checkers and constraints 310, and stimulus 308.

Figure 4:
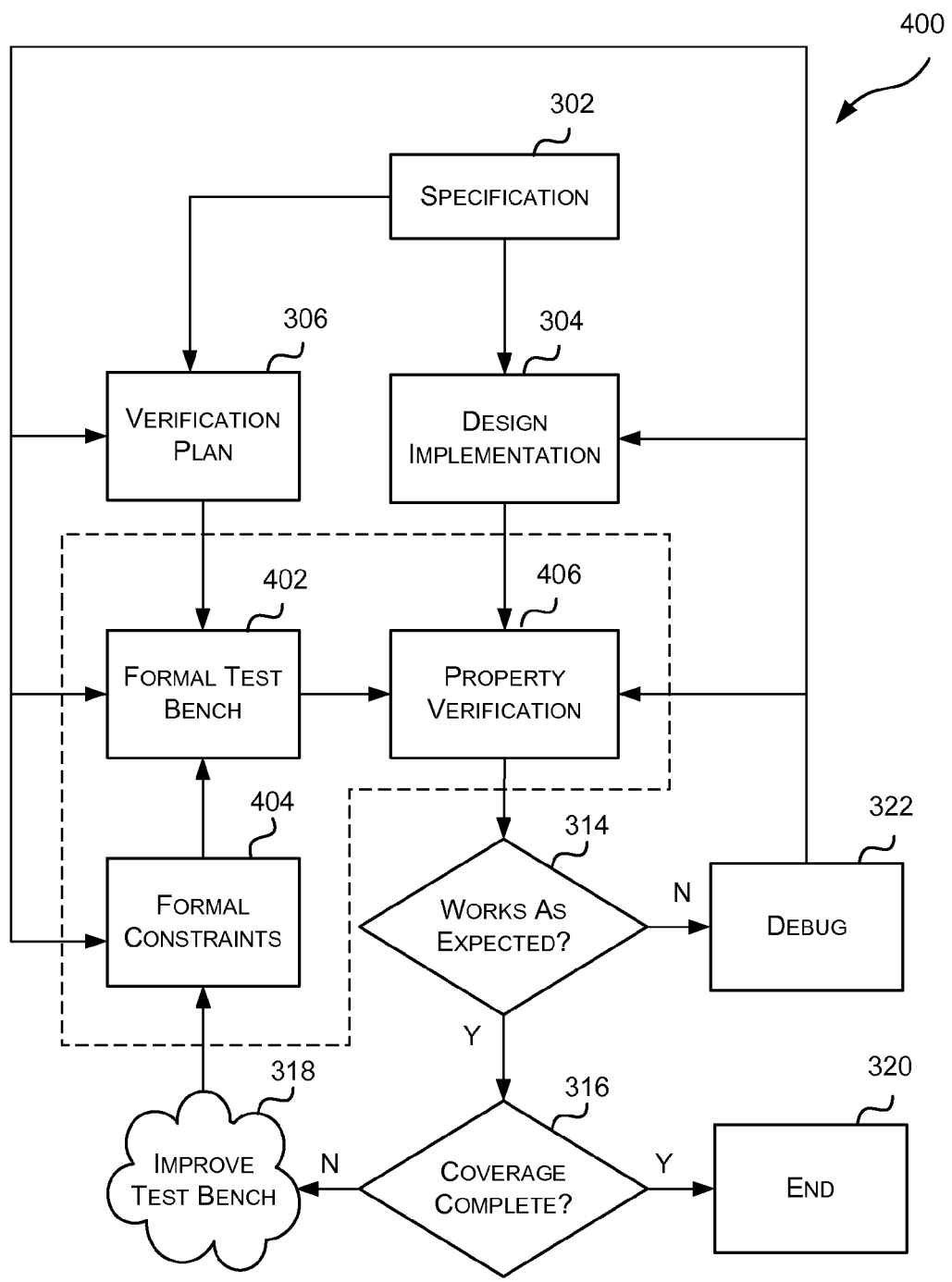
FIG. 4 is a flow diagram of a method of formal verification of a hardware design.

As described above, formal verification, in contrast to simulation based verification does not require the generation of stimulus. Reference is now made to FIG. 4 which illustrates a method 400 for formal verification of a hardware design using property checking. In property checking, part of a design (i.e. a property of the design) is proved or disproved. Method 400 is the same as method 300 except the stimulus, test bench checkers and simulation blocks 308, 310 and 312 are replaced with blocks 402, 404 and 406.

In particular, in method 400 of FIG. 4 the verification plan 306 is used to develop a formal test bench 402. The formal test bench 402 includes the property to be proved or disproved and a property verifier to verify the property.

Because a property is an alternative way of expressing part of a design a failure can be caused by unintended input or state configurations. To remove unintended configurations from interfering with the property verifications formal constraints 404 may be developed to constrain the inputs or states to produce only permissible inputs.

At block 406 the property verifier is applied to the DUT 304 to verify the property. The property verifier verifies if the design implementation (e.g. high level language implementation, done in VHDL or Verilog) meets the specification (which is expressed using properties). The design implementation is transformed into a mathematical model (e.g. a state-transition system) and the properties are expressed using mathematical logic using a precise syntax or a language with a precise mathematical syntax and semantics.

A property is verified by searching the entire reachable state space of the design implementation (e.g. state transition system) without explicitly traversing the state machine. The search is done by, for example, encoding the states using efficient Boolean encodings using Binary decision diagrams (BDDs), or using advanced SAT (satisfiability-based bounded model checking) based techniques. In some cases tools can be used to implement techniques, such as, but not limited to, abstraction, symmetry, symbolic indexing, and invariants to improve performance and achieve scalability.

Verifying properties in this manner allows a property to be exhaustively proved or disproved for all states.

Furthermore, by expressing the properties using mathematical logic the properties can be used not only to verify the design implementation, but also to serve as documentation which can be used to review and ascertain whether the design is intended to have particular behaviors.

Assertion-based verification involves the use of assertions for the verification of a specification (or part thereof) through simulation based verification (e.g. as described with reference to FIG. 2) or through formal verification (e.g. as described with reference to FIG. 3)

As is known to those of skill in the art an assertion is a statement about a specific property that is expected to hold for a design (e.g. is always true). In other words, an assertion is an expression that, if evaluated to be false on the design, indicates an error.

Within HDL designs, an assertion is an executable statement that checks for specific behavior within the HDL design. For example if a design contains a FIFO (first in first out) buffer the designer would define assertions that capture the design intent (e.g. that neither overflow nor underflow of the FIFO may occur).

An assertion is typically written in an assertion language. Assertion languages include, but are not limited to, System Verilog (SV), Property Specification Language (PSL), Incisive Assertion Library (IAL), Synopsys OVA (Open Vera Assertions), Symbolic Trajectory Evaluation (STE), SystemC Verification (SCV), O-In, Specman, and OpenVera Library (OVL). Example SV assertions for verifying a derived clock are described with reference to FIGS. 7 and 9.

Assertions can be used in simulation-based verification to monitor certain conditions. Assertions used in this way can improve observability by being able to identify bugs once they are triggered by specific stimuli (e.g. specific test vector(s)). Without assertions an error or a bug is only identified in simulation-based verification if it propagates to an observable output and it is only evident at the end of the simulation. By using assertions, errors and bugs inside the design can be checked and observed instantly, at their source.

When assertions are used in formal verification they are used to express the properties to be verified which allows the property to be proved or disproved for all possible states (as specified by any constraints). This allows bugs to be identified quickly and easily without having to develop stimuli (e.g. test vectors).

ABV in formal verification can improve controllability as compared to simulation based verification. Low controllability occurs when the number of simulation test signals or vectors required to thoroughly simulate a design becomes unmanageable. For example, a 32-bit comparator requires $2^{64}$ test vectors. This would take millions of years to verify by simulation based verification. By performing formal verification of an assertion, the 32-bit comparator can be verified in less than a minute.

While ABV provides a number of advantages over pure simulation based verification, simulation based verification has been the de facto standard for hardware design verification for quite some time thus most standard hardware blocks or elements, such as a clock, have been traditionally verified using simulation based verification. Since such verification methods have worked for such a long period of time it has not occurred to designers to change the verification method of such standard blocks or elements.

Described herein are systems and methods which use assertion-based verification to verify the period and duty cycle of a derived clock with respect to the reference clock.

Figure 5:
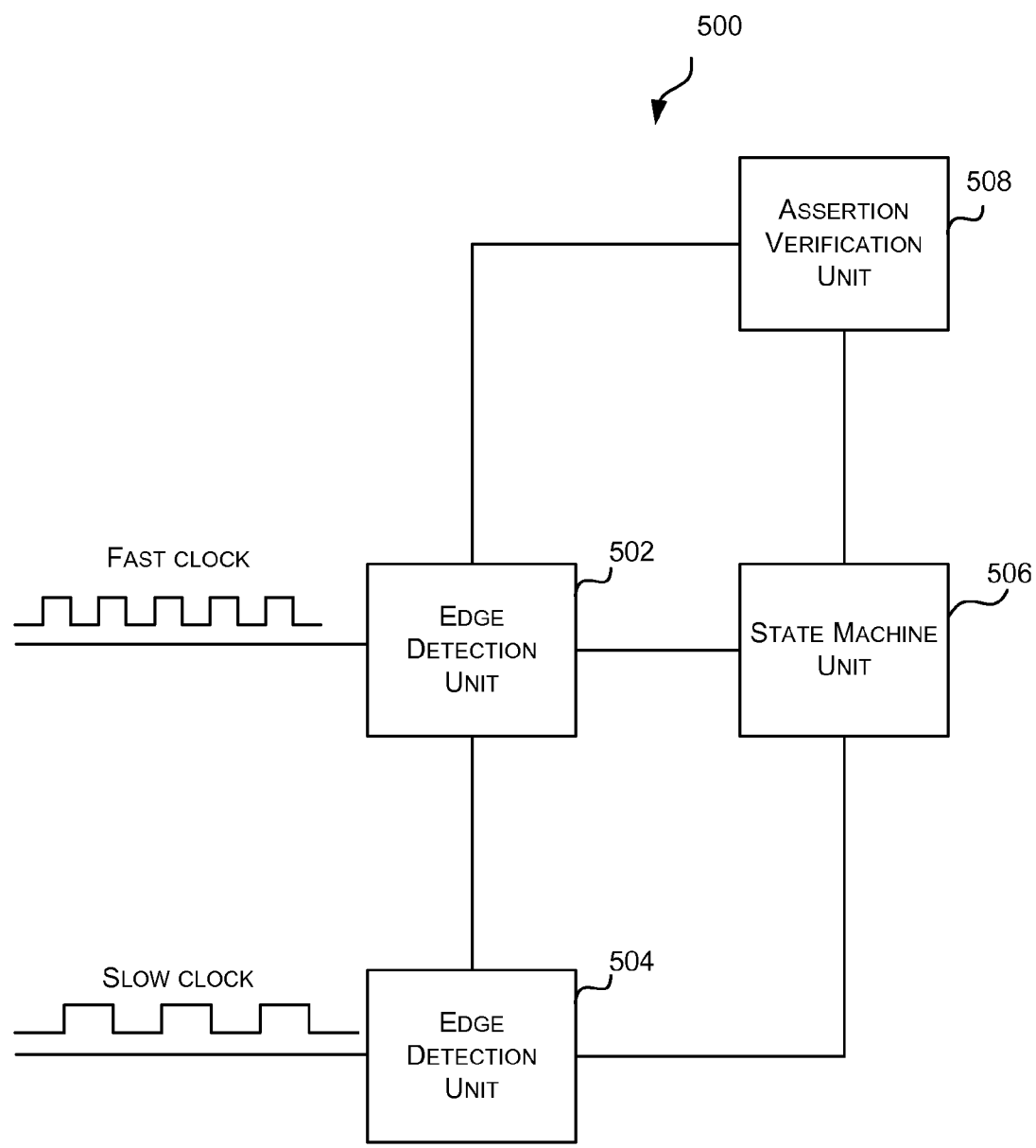
FIG. 5 is a block diagram of an example system for verifying a derived clock signal using assertion-based verification.

Reference is now made to FIG. 5 which illustrates a block diagram of a system 500 for verifying a derived clock using assertion-based verification.

In some cases the derived clock may be derived from a main or reference clock through division so that the derived clock has a lower frequency than the main or reference clock. In other cases the derived clock may be derived from a main or reference clock through multiplication so that the derived clock has a higher frequency than the main or reference clock.

Throughout this document the terms first clock and second clock will be used to describe the derived clock and the main or reference clock. The first clock is the clock with the higher frequency and the second clock is the clock with the lower frequency. Accordingly, when the derived clock is a division of the main or reference clock, the first clock will be the main or reference clock and the second clock will be the derived clock. Conversely, when the derived clock is a multiple of the main or reference clock, the first clock will be the derived clock and the second clock will be the main or reference clock.

The system 500 is designed to determine and record the number of full cycles or half cycles of the first or fast clock between the rising edge and falling edge of the second or slow clock and between the falling edge and the rising edge of the second or slow clock. As described above the part of the clock cycle between the rising edge and falling edge of a clock is referred to as the ON phase since the clock is "high" during this time; and the part of the clock cycle between the falling edge and the rising edge is referred to as the OFF phase since the clock is "low" during this time. The number of full cycles or half cycles is then verified by one or more assertions written in an assertion language.

The system 500 comprises a first edge detection unit 502, a second edge detection unit 504, a state machine unit 506, and an assertion verification unit 508.

The first edge detection unit 502 receives the first clock signal and detects the rising and/or falling edge of the first clock signal. Similarly, the second edge detection unit 504 receives the second clock signal and detects the rising and/or falling edge of the second clock signal.

The state machine unit 506 comprises one or more state machines that receive data from the first and second edge detection units 502 and 504 and use this information to determine the number of full cycles or half cycles of the first or fast clock between the rising edge and falling edge of the second or slow clock (i.e. during the ON phase of the slow clock), and between the falling edge and the rising edge of the second or slow clock (i.e. during the OFF phase of the slow clock).

For example, in some cases the state machine unit 506 may receive or obtain data from the second edge detection unit 504 that a rising edge of the second clock signal has been detected. The one or more state machines may then use the information received or obtained from the first edge detection unit 502 to count or otherwise determine the number of rising edges of the first clock signal that occur until the second edge detection unit 504 indicates that a falling edge of the second clock signal has occurred. This effectively counts the number of full cycles of the first or fast clock that occur during the ON phase of the second clock.

Once the second edge detection unit 504 indicates that the falling edge of the second clock signal has occurred, the one or more state machines use the information received or obtained from the first edge detection unit 502 to count or otherwise determine the number of rising edges of the first clock signal that occur until the second edge detection unit indicates that a rising edge of the slow clock has occurred. This effectively counts the number of full cycles of the first or fast clock that occur during the OFF phase of the second clock. An exemplary system that determines the number of full cycles of the first or fast clock between edges of the second or slow clock will be described with reference to FIGS. 7 and 8.

In other cases, the state machine unit 506 may also receive or obtain data from the first edge detection unit indicating a falling edge of the fast clock has been detected which allows the state machines to count the number of falling edges that occur in the ON and OFF phases of the slow clock. This effectively allows the system to count the number of half cycles of the first or fast clock that occurred between edges of the second of slow clock. An exemplary system that determines the number of half cycles of the fast clock between edges of the second or slow clock will be described with reference to FIGS. 9 and 10.

The assertion verification unit 508 periodically assesses one or more assertions to verify the state (e.g. count values) of the state machines and thus verify the operation of the derived clock with respect to the reference clock. In some cases the assertion verification unit 508 assesses or evaluates two assertions, one verifies the number of full cycles or half cycles of the fast clock during the ON phase of the slow clock, and the other verifies the number of full cycles or half cycles of the fast clock during the OFF phase of the slow clock. The assertions are written in an assertion language, such as, but not limited to SV. Example assertions are described with reference to FIGS. 7 and 9.

Figure 6:
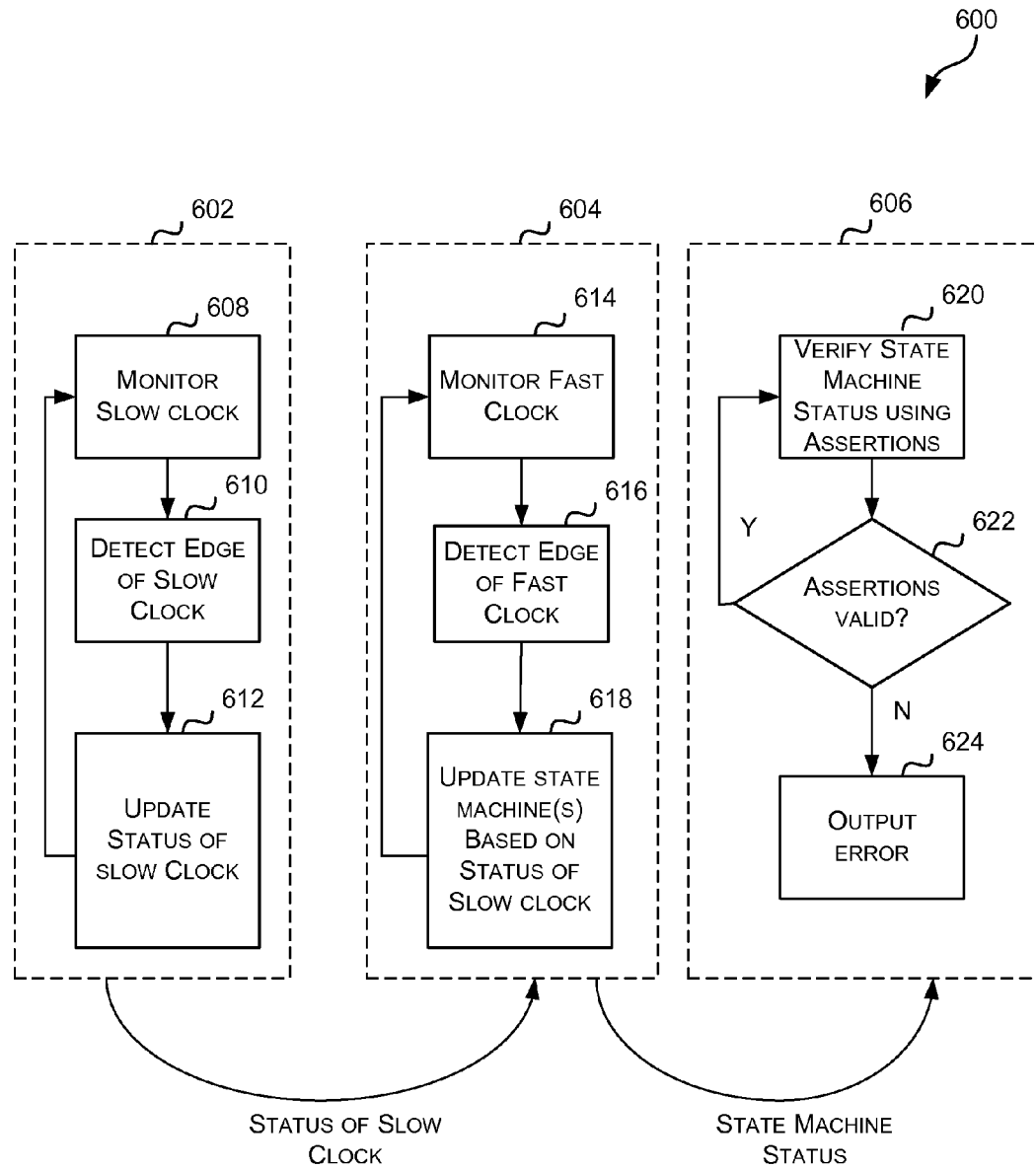
FIG. 6 is a flow diagram of an example method for verifying a derived clock signal using assertion-based verification.

Reference is now made to FIG. 6 which illustrates an example method 600 for verifying a derived clock using assertion-based verification. The method 600 counts the number of full cycles or half cycles of the first or fast clock that occur between edges of the second or slow clock. The method 600 comprises three processes 602, 604 and 606 which may be executed in parallel. The first process 602 monitors the slow clock and updates the status of the slow clock to indicate whether the slow clock is in the ON phase or the OFF phase. The second process 604 monitors the fast clock and updates one or more state machines based on the status of the slow clock. The state machines count the number of full or half cycles of the fast clock that occur during the ON and OFF phases of the slow clock. The third process 606 periodically checks the state machine output (i.e. counts) using assertions to verify the operation of the derived clock with respect to the reference clock.

In the first process 602, the second or slow clock is monitored 608 until an edge of the second or slow clock has been detected 610. The edge may be the rising or positive edge of the second or slow clock, or it may be the falling or negative edge of the slow clock. Once an edge of the second or slow clock has been detected the method 600 proceeds to block 612 where the status of the slow clock is updated to indicate whether the slow clock is in the ON phase or the OFF phase. For example, in some cases after a rising edge has been detected the status is updated to indicate the slow clock is in the ON phase; and similarly after a falling edge of the slow clock has been detected the status is updated to indicate the slow clock is in the OFF phase.

In the second process 604, the first or fast clock is monitored 614 until an edge of the first or fast clock has been detected 616. In some cases the system may be configured to only detect either the rising edge or the falling edge of the fast clock. In other cases, the system may be configured to detect both rising and falling edges of the fast clock.

Once an edge of the fast clock has been detected, at block 618 one or more state machines are updated based on the status information generated/updated by the first process 602. In some cases the system is configured to count the number of full cycles of the first or fast clock between edges of the second or slow clock. In these cases there may be one state machine for counting either the rising edges or falling edges of the first or fast clock that occur between the rising and falling edges of the second or slow clock (i.e. during the ON phase of the slow clock), and one state machine for counting either the rising edges or falling edges of the first or fast clock that occur between the falling edge and the rising edge of the second or slow clock (i.e. during the OFF phase of the slow clock). Accordingly, the state machine that is updated is selected based on the current state of the slow clock.

In other cases the system is configured to count the number of half cycles of the first or fast clock between the edges of the second or slow clock. In these cases there may be six state machines—one for counting the rising edges of the first clock between rising and falling edge of the second clock, one for counting the falling edges of the first clock between the rising and falling edge of the second clock, one for counting the rising edges of the first clock between falling and rising edges of the second clock, one for counting the falling edges of the first clock between falling and rising edges of the second clock, one for summing the rising and falling edge counts between the rising and falling edges of the second clock, and one for summing the rising and falling edge counts between the falling and rising edges of the second clock. In these cases the state machine that is selected for update is based on the status information (i.e. whether the slow clock is in an ON phase or an OFF phase) and whether the edge detected is a rising edge or a falling edge. Once the appropriate state machine has been updated the process 604 proceeds back to block 614.

In the third process 606, blocks 620 to 624 are executed to evaluate the assertions to verify the duty cycle and phase of the derived clock with respect to the reference clock. In particular, in block 620 assertions are used to assess the state machine status to verify the operation of the clock. At block 622 it is determined whether the assertions are valid. If so the process 606 proceeds back to block 620. Otherwise, the process 606 proceeds to block 624 where an error is output. In some cases block 620 may be triggered upon detecting the rising edge of the first or fast clock. However, in other cases the block 620 may be triggered by another event.

Figure 7:
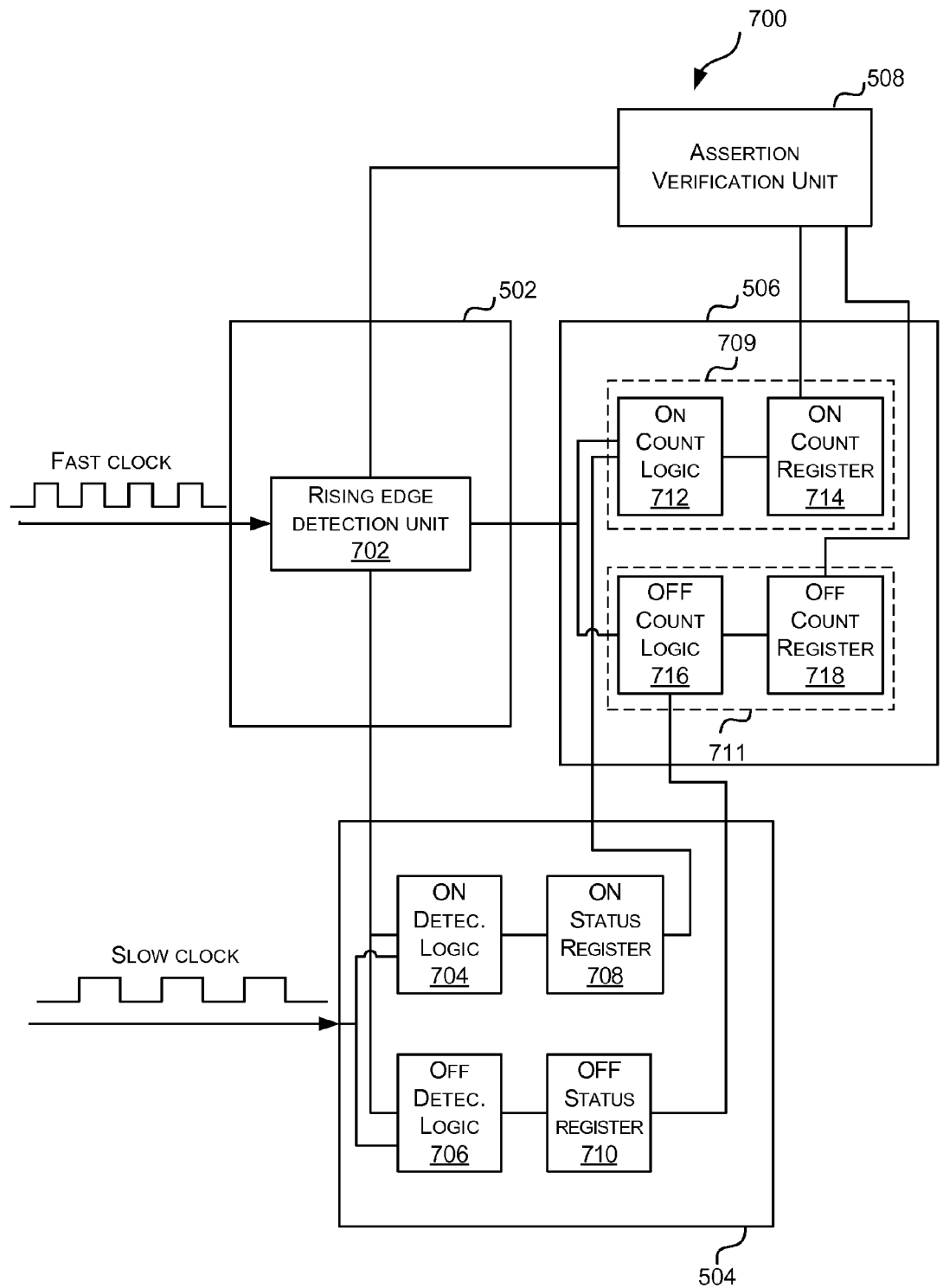
FIG. 7 is a block diagram of an example system for verifying a derived clock signal using assertion-based verification that comprises counting the number of full clock cycles of the fast clock.

Reference is now made to FIG. 7 which illustrates a block diagram of a system 700 for verifying a derived clock by verifying the number of full cycles of a fast clock within each ON and OFF phase of a slow clock using assertion-based verification.

The system 700 of FIG. 7 is designed to verify derived clocks that have a constant duty cycle (i.e. the duty cycle does not change over time) and have an integer relationship with a full cycle of reference or main clock. As described above, the fast clock may have been derived from the slow clock or the slow clock may have been derived from the fast clock. A derived clock that is generated through multiplication is said to have an integer relationship with a full cycle of the reference clock if its ON phase and OFF phase are both an integer multiple of the period of the reference or main clock. A derived clock that is generated through division is said to have an integer relationship with a full cycle of the reference clock if its ON phase and OFF phase are both an integer fraction (i.e. 1/n where n is an integer) of the period of the main or reference clock.

Like the system 500 of FIG. 5, system 700 comprises a first edge detection unit 502, a second edge detection unit 504, a state machine unit 506, and an assertion verification unit 508.

The first edge detection unit 502 receives the first or fast clock and outputs an indication when it detects the rising edge of the first or fast clock. In the example shown in FIG. 7, the first edge detection unit 502 comprises a rising edge detection unit 702 configured to receive the first or fast clock, detect the rising edge of the fast clock and output an indication that the rising edge was detected. The indication is then provided to the other units of the systems (i.e. the second edge detection unit 504, the state machine unit 506 and the assertion verification unit 508).

In other examples the falling edge of the fast clock may be used instead of the rising edge. In these examples the first edge detection unit may comprise a falling edge detection unit instead of a rising edge detection unit.

In some cases instead of comprising a separate unit to detect the rising (or falling) edge of the fast clock, the fast clock may be directly fed or provided to the other units of the system (e.g. the second edge detection unit 504, the state machine unit 506 and the assertion verification unit 508). The other units then detect the rising (or falling) edge of the fast clock and act accordingly.

The second edge detection unit 504 receives the second or slow clock and determines whether the slow clock is in the ON phase or the OFF phase. In the example shown in FIG. 7, the second edge detection unit 504 comprises ON detection logic 704 that monitors the slow clock to detect when the slow clock is in the ON phase (i.e. it has detected a rising edge). The output of the analysis is stored in an ON status register 708. The second edge detection unit 504 also comprises OFF detection logic 706 which monitors the slow clock to determine when the slow clock is in the OFF phase (i.e. it has detected a falling edge of the slow clock). The output of the analysis is stored in an OFF status register 710. Accordingly, when the ON status register 708 is set the slow clock is in the ON phase and similarly when the OFF status register 710 is set the slow clock is in the OFF phase.

The following is example SV code for implementing the ON detection logic 704:

```
always @(posedge clk or negedge resetn)
    if (!resetn)
        derived_clk_re_seen <= 1'b0;
    else if (!derived_clk_re_seen && derived_clk)
        derived_clk_re_seen <= 1'b1;
    else if (derived_clk_re_seen && !derived_clk)
        derived_clk_re_seen <= 1'b0;
``` where clk is the fast clock, derived_clk is the slow clock, derived_clk_re_seen is the ON status register 708 and resetn is a reset signal which is used to disable evaluation upon a reset.

In this example SV implementation of the ON detection logic 704, each time the ON detection logic 704 receives an indication that the positive edge of the fast clock is detected it reads the value of the slow clock and the ON status register 708. If the ON status register 708 is not set (i.e. it has a low value) and the slow clock is high then a rising edge must have occurred and the ON status register 708 is set (i.e. it is set to a high value). If, however, the ON status register 708 is set (i.e. it has a high value) and the slow clock is low then a falling edge must have occurred since the last rising edge and the ON status register 708 is reset (i.e. it is set to a low value). It will be evident to a person of skill in the art that this is an example only and the ON detection logic 704 may be implemented in another suitable manner.

The following is example SV code for implementing the OFF detection logic 706:

```
always @(posedge clk or negedge resetn)
    if (!resetn)
        derived_clk_fe_seen <= 1'b0;
    else if (!derived_clk_fe_seen && !derived_clk)
        derived_clk_fe_seen <= 1'b1;
    else if (derived_clk_fe_seen && derived_clk)
        derived_clk_fe_seen <= 1'b0;
``` where derived_clk_fe_seen is the OFF status register 710.

In this example SV implementation of the OFF detection logic 706, each time the OFF detection logic 706 receives an indication that the positive edge of the fast clock is detected it reads the value of the slow clock and the OFF status register 710. If the OFF status register 710 is not set (i.e. it has a low value) and the slow clock is low then a falling edge must have occurred and the OFF status register 710 is set (i.e. it is set to a high value or a non-zero value). If, however, the OFF status register 710 is set (i.e. it has a high value or a non-zero value) and the slow clock is high then a rising edge must have occurred since the last falling edge and the OFF status register 710 is reset (i.e. it is set to a low value or a zero value). It will be evident to a person of skill in the art that this is an example only and the OFF detection logic 706 may be implemented in another suitable manner.

The state machine unit 506 counts the number of full cycles of the fast clock in the ON and OFF cycles of the slow clock. In the example shown in FIG. 7, the state machine unit 506 comprises two state machines 709 and 711. The first state machine 709 counts the number of full cycles of the fast clock in the ON phase of the slow clock (i.e. between the rising edge and the falling edge of the slow clock). The second state machine 711 counts the number of full cycles of the fast clock in the OFF phase of the slow clock (i.e. between the falling edge and rising edge of the slow clock).

In the example shown in FIG. 7, the first state machine 709 comprises ON count logic 712 for counting the number of full cycles of the fast clock in the ON phase of the slow clock. The count is stored in an ON count register 714. When the ON count logic 712 receives an indication from the rising edge detection unit 702 that a rising edge of the fast clock has been detected it reads the ON status register 708 to determine whether the slow clock is in the ON phase. If the ON status register 708 is enabled or high the ON count register 714 is incremented or updated.

The following is example SV code for implementing the ON count logic 712:

```
always @(posedge clk or negedge resetn)
    if (!resetn)
        count_cycles_re_fe <= 'b0;
    else if (derived_clk_re_seen)
        count_cycles_re_fe <= count_cycles_re_fe + 1'b1;
    else if (!derived_clk_re_seen)
        count_cycles_re_fe <= 'b0;
``` where count_cycles_re_fe is the ON count register 714.

In this example SV implementation of the ON count logic 712, when the ON count logic 712 receives an indication that the positive edge of the fast clock has been detected it reads the value of the ON status register 708. If the ON status register 708 is set (i.e. the slow clock is in the ON phase) then the ON count logic 712 increments the ON count register 714. If, however, the ON status register 708 is not set (i.e. the slow clock is in the OFF phase) then the ON count logic 712 resets the ON count register 714. It will be evident to a person of skill in the art that this is an example only and the ON count logic 712 may be implemented in another suitable manner.

The second state machine 711 operates in the same manner as the first state machine 709 to count the number of full cycles of the fast clock that occur during the OFF phase of the slow clock. The second state machine 711 comprises OFF count logic 716 which counts the number of full cycles in the OFF phase. The count is then stored in an OFF count register 718.

The following is example SV code for implementing the OFF count logic 716:

```
always @(posedge clk or negedge resetn)
    if (!resetn)
        count_cycles_fe_re <= 'b0;
    else if (derived_clk_fe_seen)
        count_cycles_fe_re <= count_cycles_fe_re + 1'b1;
    else if (!derived_clk_fe_seen)
        count_cycles_fe_re <= 'b0;
``` where count_cycles_fe_re is the OFF count register 718.

In this example SV implementation of the OFF count logic 716, when the OFF count logic 716 receives an indication that the rising or positive edge of the fast clock has been detected it reads the value of the OFF status register 710. If the OFF status register 710 is set (i.e. the slow clock is in the OFF phase) then the OFF count logic 716 increments the OFF count register 718. If, however, the OFF status register 710 is not set (i.e. the slow clock in the ON phase) then the OFF count logic 716 resets the OFF count register 718. It will be evident to a person of skill in the art that this is an example only and the OFF count logic 716 may be implemented in another suitable manner.

The assertion verification unit 508 periodically verifies the values of the ON and OFF count registers 714 and 718 using one or more assertions. In some cases the assertion verification unit 508 is configured to evaluate the assertions each time the rising edge detection unit 702 detects a rising edge of the fast clock. If the assertions are true then the verification continues as normal. If however, at least one of the assertions are not true then the assertion verification unit 508 outputs an error message.

The following is an example of SV code of a first example assertion which may be evaluated by the assertion verification unit 508 to verify the ON count register 714 value (i.e. it checks that the correct number of full cycles of the fast clock occur during the ON phase of the slow clock):

```
as_check_count_RE_FE:
assert property (@(posedge clk)disable iff (!resetn)
    1'b1 ##1 $fell(derived_clk_re_seen) |-> (count_cycles_re_fe ==
    RATIO1));
``` where clk is the fast clock and RATIO1 is the number of full clock cycles that should occur during the ON phase of the slow clock. In the example shown above, the assertion is evaluated at the rising edge of the fast clock. However, in other examples other events may be used to trigger evaluation of the assertion.

This first example assertion states at the time the ON status register 708 value falls (i.e. goes from having a high value to a low value) the value of the ON count register 714 should be equal to RATIO1.

The following is an example of SV code of a second assertion which may be evaluated by the assertion verification unit 508 to verify the OFF count register 718 value (i.e. it checks that the correct number of full cycles of the fast clock occur during the OFF phase of the slow clock):

```
as_check_count_FE_RE:
assert property (@(posedge clk)disable iff (!resetn)
    1'b1 ##1 $fell(derived_clk_fe_seen) |->
    (count_cycles_fe_re == RATIO2));
``` where RATIO2 is the number of full clock cycles of the fast clock that should occur during the OFF phase of the slow clock. Where a clock has a 50% duty cycle RATIO1 and RATIO2 are equal. In these cases only a single RATIO value may be used for both assertions.

This second example assertion states that at the time the OFF status register 710 value falls (i.e. goes from the having a high value to a low value) the value of the OFF count register 718 should be equal to RATIO2.

It will be evident to a person of skill in the art that these are examples only and other suitable assertions may be used. For example, while SV concurrent assertions are used in the examples shown above, it will be evident to those of skill in the art that assertions written in other languages and immediate assertions may also be used.

Although system 700 of FIG. 7 has been described as being designed to verify derived clocks with a constant duty cycle (e.g. by using one RATIO1 value and one RATIO2 value), in other examples system 700 may be modified to verify derived clocks with a variable duty cycle. For example instead of comparing the ON and OFF count registers to RATIO1 and RATIO2 respectively. The ON and OFF count registers may be compared to multiple RATIO1 and RATIO2 values, each ratio representing the possible valid values for the ON and OFF count registers.

For example, if a derived clock signal is four times as slow as reference clock and has a 50% constant duty cycle the ratio between the slow clock and the reference clock will be 2 in the ON phase and 2 in the OFF phase. Therefore the ON and OFF count registers are compared to the value 2. If, however, a derived clock signal is four times as slow as the reference clock, but alternates between a 25% duty cycle and a 75% duty cycle, then the ratio between the slow clock and the reference clock will alternate between 1 and 3 in the ON phase and 3 and 1 in the OFF phase. Accordingly, the ON and OFF count registers may be compared to both the values 1 and 3.

Because the system 700 of FIG. 7 is based on a simple concept of counting using basic logic it allows a derived clock to be verified in a simple manner with minimal logic. In particular, the system 700 requires only two logic modules, two registers, two state machines and two assertions. As shown above, this can be implemented using very few lines of code. This is in contrast to simulation-based verification which is a tedious process that requires quite extensive and complicated code.

Furthermore, the system 700 is very adaptable. In particular, the aspects of the system can be written or defined so that they can be used to verify any derived clock that meets certain requirements (e.g. has an integer relationship with a full cycle of the main or reference clock). For example, the RATIO1 and RATIO2 (and any n) values can be obtained from a configuration file at test time which can be used to create an instance of the system 700 for each derived clock-reference clock pair in the design. Accordingly, the same code can be used to test clocks with variable or fixed duty cycles and clocks with a variety of different duty cycles. This is in stark contrast to simulation-based verification which requires specific stimuli to be generated for each derived clock-reference clock pair.

The system 700 is also very portable. In particular once the system 700 is linked to the derived and reference clocks (e.g. first/fast and second/slow clocks) via binding, for example, the system 700 can be used to verify the clock regardless of last minute changes made to the clock (e.g. re-wiring of the clock). This is again in contrast to simulation-based verification. In particular, while it may be easy to re-wire the code for a clock to meet new requirements, re-verifying such as change required re-testing the new design with a new set of test vectors and simulations which is not only practically difficult, but can cause a significant delay to the delivery of the final product and may reduce the quality of the verification.

The system 700, due to its simplicity, also reduces the amount of time the test system can be brought online in contrast to simulation-based verification such as UVM (Universal Verification Methodology).

Figure 8:
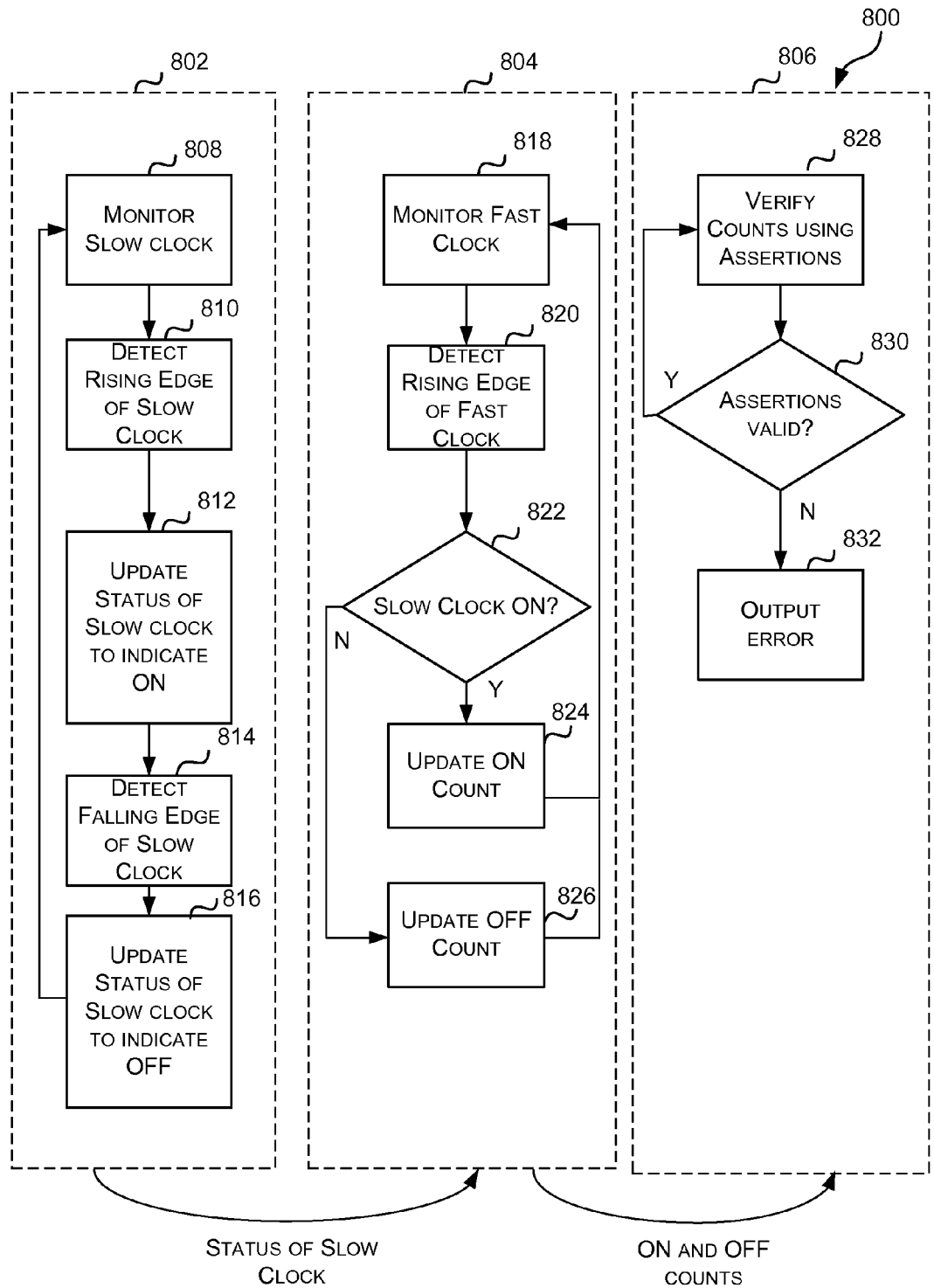
FIG. 8 is a flow diagram of an example method for verifying a derived clock signal using assertion-based verification that comprises counting the number of full clock cycles of the fast clock.

Reference is now made to FIG. 8 which illustrates an example method 800 for verifying a derived clock using the system 700 of FIG. 7. The method 800 counts the number of full cycles of the first or fast clock that occur between edges of the second or slow clock. The method 800 comprises three processes 802, 804 and 806 which may be executed in parallel. The first process 802 monitors the slow clock and updates the status of the slow clock to indicate whether the slow clock is in the ON phase or the OFF phase. The second process 804 monitors the fast clock and updates one or more state machines based on the status of the slow clock to count the number of full cycles of the fast clock that occur during the ON and OFF phases of the slow clock. The third process 806 periodically checks the state machine counts using assertions to verify the operation of the derived clock with respect to the reference clock.

In the first process 802, the second or slow clock is monitored 808 until a rising edge of the second or slow clock is detected 810. Once a rising edge of the second or slow clock has been detected the status of the slow clock is updated to indicate that the slow clock is in the ON phase 812. Then when a falling edge of the slow clock is subsequently detected 814 the status of the slow clock is updated to indicate that the slow clock is in the OFF phase 816. The process 802 then repeats from block 808.

In some cases, as shown in FIG. 7, the status information is stored in two registers, one register indicates that a rising edge has been detected and the other register indicates that a falling edge has been detected. In these cases, when a rising edge of the second or slow clock is detected the rising edge register is set and the falling edge register is reset. Similarly when the falling edge of the second or slow clock has been detected the falling edge register may be set and the rising edge register is reset.

In the second process 804, the rising edges of the fast clock are counted in the ON and OFF phases of the slow clock to determine the number of full cycles of the fast clock that occur during the ON and OFF phases of the slow clock. In particular, the first or fast clock is monitored 818 until a rising edge of the first or fast clock has been detected 820. Once the rising edge of the fast clock has been detected the status information generated by the first process 802 is used to determine whether the slow clock is in the ON phase 822. If the slow clock is in the ON phase then an ON counter (i.e. a counter used to count the number of rising edges of the fast clock during the ON phase of the slow clock) is updated or incremented 824. A corresponding OFF counter (i.e. a counter used to count the number of rising edges of the fast clock during the OFF phase) is also reset (e.g. set to zero). If, however, the slow clock is in the OFF phase then the OFF counter is updated or incremented and the ON counter is reset (e.g. set to zero) 826. The process 804 then proceeds back to block 818 where the fast clock is monitored for the next rising edge.

In other examples the system may be configured to detect and count the falling edges of the fast clock instead.

In the third process 806, blocks 828 to 832 are executed to evaluate the assertions to verify the duty cycle and phase of the derived clock with respect to the reference clock. In particular, in block 828 assertions are used to assess the counts generated by the second process 804 to verify the operation of the derived clock. At block 830 it is determined whether the assertions are valid. If so the process 806 proceeds back to block 828. Otherwise, the process 806 proceeds to block 832 where an error is output. In some cases block 828 may be triggered upon detecting the rising edge of the first or fast clock. However, in other cases block 828 may be triggered by another event.

Figure 9:
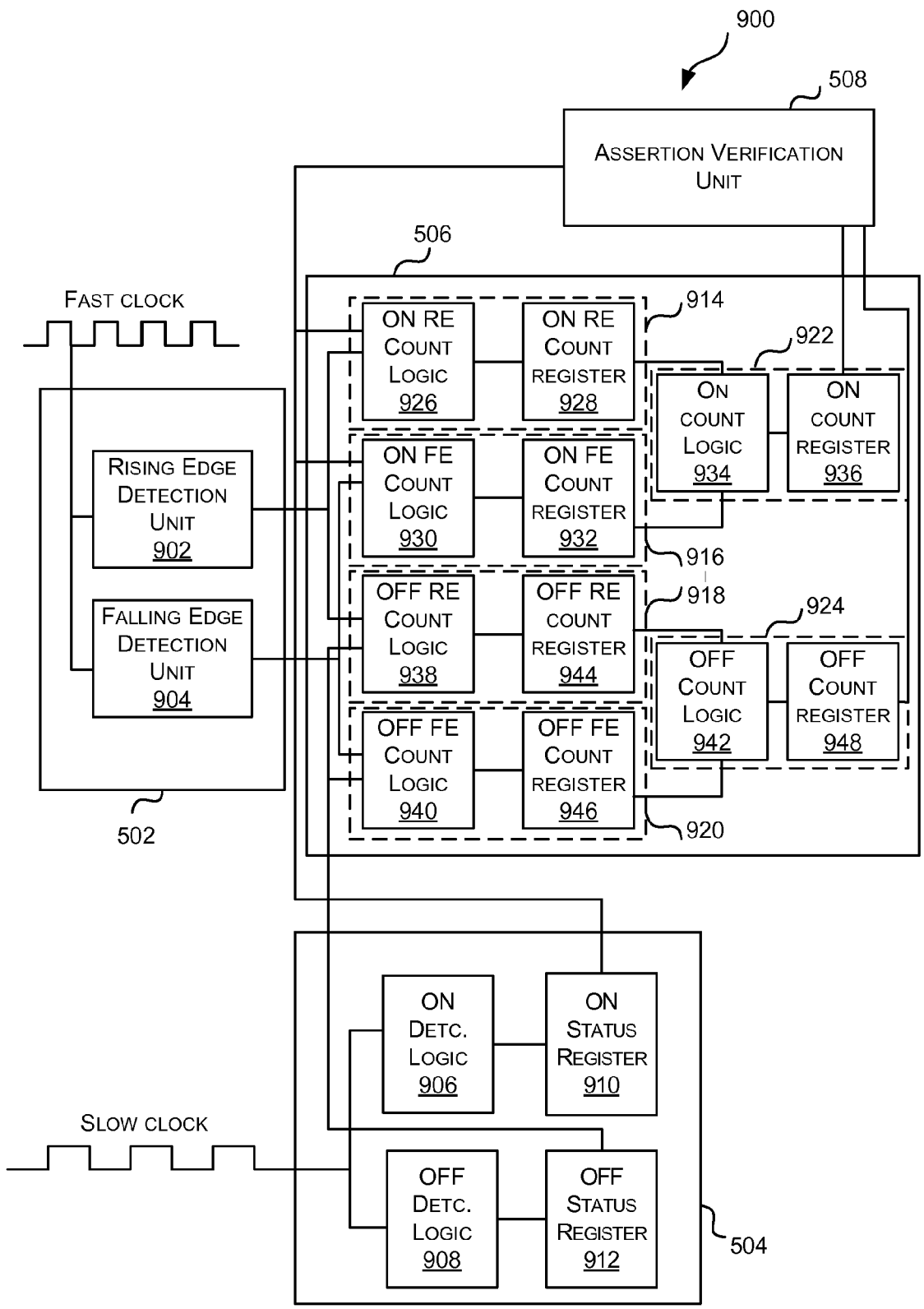
FIG. 9 is a block diagram of an example system for verifying a derived clock signal using assertion-based verification that comprises counting the number of half clock cycles of the fast clock.

Reference is now made to FIG. 9 which illustrates a block diagram of an example system 900 for verifying a derived clock by verifying the number of half cycles of a fast clock within each ON and OFF phase of a slow clock using assertion-based verification. As described above the fast clock may have been derived from the slow clock or the slow clock may have been derived from the fast clock.

The system 900 of FIG. 9 is more complicated than the system 700 of FIG. 7, however, it may be used to verify derived clocks that have a constant or non-constant (i.e. variable) duty cycle and have an integer relationship with a half cycle of the reference or main clock. A derived clock that is generated through multiplication is said to have an integer relationship with a half cycle of the reference clock if the derived clock's ON phase and OFF phase are both integer multiples of half the period of the reference or main clock. A derived clock that is generated through division is said to have an integer relationship with a half cycle of the reference clock if the derived clock's ON phase and OFF phase are both an integer faction (i.e. 1/n where n is an integer) of half the period of the main or reference clock.

Like the systems 500 and 700 of FIGS. 5 and 7, system 900 comprises a first edge detection unit 502, a second edge detection unit 504, a state machine unit 506, and an assertion verification unit 508.

The first edge detection unit 502 receives the first or fast clock and outputs an indication when it detects the rising edge of the first or fast clock and another indication when it detects the falling edge of the fast clock. In the example shown in FIG. 9, the first edge detection unit 502 comprises a rising edge detection unit 902 and a falling edge detection unit 904.

The rising edge detection unit 902, like the rising edge detection unit 702 of FIG. 7, is configured to receive the first or fast clock, detect the rising edge of the fast clock and output an indication that the rising edge was detected. The indication is then provided to one or more of the other units of the system 900 (i.e. the second edge detection unit 504, the state machine unit 506 and the assertion verification unit 508).

The falling edge detection unit 904 is configured to receive the fast clock, detect the falling edge of the fast clock and output an indication that the falling edge was detected. The indication is then provided to one or more of the other units of the system 900 (i.e. the second edge detection unit 504, the state machine unit 506 and the assertion verification unit 508).

In some cases instead of comprising a separate unit (e.g. first edge detection unit 502) to detect the rising and falling edges of the fast clock, the fast clock may be directly fed or provided to the other units of the system (e.g. the second edge detection unit 504, the state machine unit 506 and the assertion verification unit 508). The other units then detect the rising and/or falling edge of the fast clock and act accordingly.

The second edge detection unit 504 receives the second or slow clock and detects the rising and falling edges of the slow clock to determine whether the slow clock is in the ON phase or the OFF phase. In the example shown in FIG. 9, like the example shown in FIG. 7, the second edge detection unit 504 comprises ON detection logic 906 that monitors the slow clock to detect when the slow clock is in the ON phase. The result of the detection is stored in an ON status register 910. The second edge detection unit 504 also comprises OFF detection logic 908 that monitors the slow clock to detect when the slow clock is in the OFF phase. The result of the detection is stored in the OFF status register 912. Therefore when ON status register 910 is set the slow clock is in the ON phase and similarly when the OFF status register 912 is set the slow clock is in the OFF phase.

The following is example SV code for implementing the ON detection logic 906:

```
always @(*)
   begin
      derived_clk_re_seen = 1'b0;
      if (!derived_clk_re_seen && derived_clk)
         derived_clk_re_seen = 1'b1;
   end
``` where clk is the fast clock, derived_clk is the slow clock, and derived_clk_re_seen is the ON status register 910. As is known to those of skill in the art "always @(*)" indicates that the code that follows will be executed or triggered by a change in state of any of the signals in the system. A signal is any element in the system that can change state, such as a continuous signal (e.g. clock) or a register. For example, in the system 900 of FIG. 9 the above code would be executed when any of the following change state: the fast clock, the slow clock, and any of the eight registers.

In this example SV implementation of the ON detection logic 906, each time a trigger event occurs the ON status register 910 is read and the slow clock is sampled. If the ON status register 910 is not set (i.e. it has a low or zero value) and the slow clock is high then a rising edge must have occurred and the ON status register 910 is set (i.e. it is set to a high value). Otherwise the ON status register 910 is reset (i.e. it is set to a low or zero value). It will be evident to a person of skill in the art that this is an example only and the ON detection logic 906 may be implemented in another suitable manner.

The following is example SV code for implementing the OFF detection logic 908:

```
always @(*)
   begin
      derived_clk_fe_seen = 1'b0;
      if (!derived_clk_fe_seen && !derived_clk)
         derived_clk_fe_seen = 1'b1;
   end
``` where derived_clk_fe_seen is the OFF status register 912.

In this example SV implementation of the OFF detection logic 908, each time a trigger event occurs the OFF status register 912 is read and the slow clock is sampled. If the OFF status register 912 is not set (i.e. it has a low or zero value) and the slow clock is low then a falling edge must have occurred and the OFF status register 912 is set (i.e. it is set to a high or non-zero value). Otherwise the OFF status register 912 is reset (i.e. it is set to a low value). It will be evident to a person of skill in the art that this is an example only and the OFF detection logic 908 may be implemented in another suitable manner.

The state machine unit 506 counts the number of half cycles of the fast clock in the ON and OFF cycles of the slow clock. In the example shown in FIG. 9, the state machine unit 506 comprises six state machines 914, 916, 918, 920, 922, 924. The first state machine 914 counts the number of rising edges of the fast clock that occur during the ON phase of the slow clock (i.e. between the rising edge and the falling edge of the slow clock). The second state machine 916 counts the number of falling edges of the fast clock that occur during the ON phase of the slow clock. The third state machine 918 counts the number of rising edges of the fast clock that occur during the OFF phase of the slow clock (i.e. between the falling edge and rising edge of the slow clock). The fourth state machine 920 counts the number of falling edges of the fast clock that occur during the OFF phase of the slow clock. The fifth state machine 922 combines the counts generates by the first and second state machines to obtain a total number of half cycles of the fast clock that occur during the ON phase of the slow clock. The sixth state machine 924 combines the counts generates by the third and fourth state machines to obtain a total number of half cycles of the fast clock that occur during the OFF phase of the slow clock.

In the example shown in FIG. 9, the first state machine 914 comprises logic 926 for counting the number of rising edges of the fast clock that occur during the ON phase of the slow clock. This count is then stored in a first register 928. The logic 926 receives an indication from the rising edge detection unit 902 that a rising edge of the fast clock has been detected. It then uses the status of the ON status register 910 to determine whether the slow clock is in the ON phase. If the slow clock is in the ON phase, the first register 928 is incremented or updated.

The following is example SV code for implementing the logic 926:

```
always @(posedge clk or negedge resetn)
   if (!resetn)
      count_half_cycles_re_fe1 <= 'b0;
   else if (derived_clk_re_seen)
      count_half_cycles_re_fe1 <=
         count_half_cycles_re_fe1 + 1'b1;
   else if (!derived_clk_re_seen)
      count_half_cycles_re_fe1 <= 'b0;
``` where count_half_cycles_re_fe1 is the first register 928.

In this example SV implementation of the first logic 916, when the logic 926 receives an indication that the rising or positive edge of the fast clock is detected it reads the value of the ON status register 910. If the ON status register 910 is set (i.e. the slow clock is in the ON phase) then the logic 926 increments the first register 928. If, however, the ON status register 910 is not set (i.e. the slow clock in the OFF phase) then the logic 926 resets the first register 928 to a zero value.

The second state machine 916 comprises logic 930 for counting the number of falling edges of the fast clock that occur during the ON phase of the slow clock. This count is then stored in a second register 932. The logic 930 receives an indication from the falling edge detection unit 904 that a falling edge of the fast clock has been detected. It then uses the status of the ON status register 910 to determine whether the slow clock is in the ON phase. If the slow clock is in the ON phase, the second register 932 is incremented or updated.

The following is example SV code for implementing the logic 930:

```
always @(negedge clk or negedge resetn)
    if (!resetn)
        count_half_cycles_re_fe2 <= 'b0;
    else if (derived_clk_re_seen)
        count_half_cycles_re_fe2 <=
            count_half_cycles_re_fe2 + 1'b1;
    else if (!derived_clk_re_seen)
        count_half_cycles_re_fe2 <= 'b0;
``` where count_half_cycles_re_fe2 is the second register 932.

In this example SV implementation of the second logic 930, when the logic 930 receives an indication that the falling or negative edge of the fast clock is detected it reads the value of the ON status register 910. If the ON status register 910 is set (i.e. the slow clock is in the ON phase) then the logic 930 increments the second register 932. If, however, the ON status register 910 is not set (i.e. the slow clock in the OFF phase) then the logic 930 resets the second register 932 to a zero value.

The fifth state machine 922 comprises logic 934 for counting the total number of half cycles that occur during the ON phase of the slow clock by combining the rising edge and falling edge counts generated by the first and second state machines 914 and 916. This count is then stored in a fifth register 936.

The following is example SV code for implementing the fifth logic 934:

```
always @(*)
    begin
        count_half_cycles_re_fe = 'b1;
        if (derived_clk_re_seen)
            begin
                count_half_cycles_re_fe =
                    count_half_cycles_re_fe +
                    count_half_cycles_re_fe1 +
                    count_half_cycles_re_fe2;
            end
    end
``` where count_half_cycles_re_fe is the fifth register 936.

In this example SV implementation of the fifth logic 934, each time a trigger event occurs the ON status register 910 is read. If the ON status register 910 is set (i.e. the slow clock is in the ON phase) then the logic 934 adds the first register 928 to the second register 932 and stores it in the fifth register 936. If, however, the ON status register 910 is not set (i.e. the slow clock in the OFF phase) then the logic 934 resets the fifth register 936 to a value of one.

The third, fourth and sixth state machines 918, 920 and 924 like the first, second and fifth state machines 914, 916, and 922 each comprise logic 938, 940 and 942 and a corresponding register 944, 946, 948. The third, fourth and sixth state machines 918, 920 and 924 operate in the same manner as the first, second and fifth state machines 914, 916, 922 respectively to count the number of rising and falling edges of the fast clock during the OFF phase of the slow clock.

The following is example SV code for implementing the third logic 938:

```
always @(posedge clk or negedge resetn)
    if (!resetn)
        count_half_cycles_fe_re1 <= 'b0;
    else if (derived_clk_fe_seen)
        count_half_cycles_fe_re1 <=
            count_half_cycles_fe_re1 + 1'b1;
    else if (!derived_clk_fe_seen)
        count_half_cycles_fe_re1 <= 'b0;
``` where count_half_cycles_fe_re1 is the third register 944.

The following is example SV code for implementing the fourth logic 940:

```
always @(negedge clk or negedge resetn)
    if (!resetn)
        count_half_cycles_fe_re2 <= 'b0;
    else if (derived_clk_fe_seen)
        count_half_cycles_fe_re2 <=
            count_half_cycles_fe_re2 + 1'b1;
    else if (!derived_clk_fe_seen)
        count_half_cycles_fe_re2 <= 'b0;
``` where count_half_cycles_fe_re2 is the fourth register 946.

The following is example SV code for implementing the sixth logic 942:

```
always @(*)
    begin
        count_half_cycles_fe_re = 'b1;
        if (derived_clk_fe_seen)
            begin
                count_half_cycles_fe_re =
                    count_half_cycles_fe_re +
                    count_half_cycles_fe_re1 +
                    count_half_cycles_fe_re2;
            end
    end
``` where count_half_cycles_fe_re is the sixth register 948.

The assertion verification unit 508 periodically verifies the values of the state machine registers using one or more assertions. In some cases the assertion verification unit 508 is configured to evaluate the assertions each time the rising edge detection unit 902 detects a rising edge of the fast clock. If the assertions are true then the testing continues as normal. If however, if at least one assertion is not true then the assertion verification unit 508 outputs an error message. Where the assertion is used in formal verification the error message may be a status error and formal verification may be aborted at the point the assertion fails. Where, however, the assertion is used in simulation based verification the message may be a string message. The simulation may or may not continue beyond the point at which the assertion fails depending on how the test environment is configured.

In some cases the assertion verification unit 508 is configured to evaluate two assertions. The first assertion verifies the number of half cycles of the fast clock that occur during the ON phase of the slow clock and the second assertion verifies the number of half cycles of the fast clock that occur during the OFF phase of the slow clock. In these cases, only by verifying both assertions can the operation of the derived clock be verified.

The following is an example of SV code of a first example assertion which may be evaluated by the assertion verification unit 508 to verify the correct number of half cycles of the fast clock that occur during the ON phase of the slow clock:

```
as_check_count_half_cycles_RE_FE_1:
assert property
    (@(posedge clk)disable iff (!resetn)
        1'b1 ##1 $fell(derived_clk_re_seen)
        |=> @(negedge derived_clk)
        (count_half_cycles_re_fe == ON) ||
        (count_half_cycles_re_fe == ON-n));
``` where clk is the fast clock and ON is the number of half clock cycles that could occur during the ON phase of the slow clock, n is an integer offset so that ON-n is alternate number of half cycles that could occur during the ON phase of the slow clock. In this example the assertion is evaluated at the rising edge of the fast clock. However, in other examples other events (e.g. the negative edge of the fast clock) may be used to trigger evaluation of the assertion.

This first example assertion states at the time the ON status register 910 value falls (i.e. goes from having a high value to a low value indicating the end of the ON phase) the value of the fifth register 936 (the total half cycle count during the ON phase) should be equal to ON or ON-n. This allows the system 900 to be used to verify derived clock signals with non-constant or variable duty cycles. For example, in FIG. 2, the fourth clock signal 208 alternates between a 60% duty cycle and a 40% duty cycle. In the 60% duty cycle three half cycles of the reference/fast clock (e.g. the first clock signal 202) occur during the ON phase and two half cycles of the reference/fast clock (e.g. the first clock signal 202) occur during the OFF phase. In the 40% duty cycle this is reversed. Specifically, two half cycles of the reference/fast clock (e.g. the first clock signal 202) occur during the ON phase and three half cycles of the reference/fast clock (e.g. the first clock signal 202) occur during the OFF phase. Accordingly, the number of half cycles in the ON phase may be 3 or 2. Accordingly, if ON is set to 3 then n may be set to 1 so that the value of the fifth register is compared to ON (3) or ON-n (2).

Where a clock has more than two different duty cycles there may be additional n values which may be used to generate new comparison values.

The following is an example of SV code of a second example assertion which may be evaluated by the assertion verification unit 508 to verify the correct number of half cycles of the fast clock that occur during the OFF phase of the slow clock:

```
as_check_count_half_cycles_FE_RE_2:
    assert property
        (@(posedge clk)disable iff (!resetn)
```
-continued
```
        1'b1 ##1 $fell(derived_clk_fe_seen)
        |=> @(posedge derived_clk)
        (count_half_cycles_fe_re == OFF-n) ||
        (count_half_cycles_fe_re == OFF));
``` where OFF is the number of half clock cycles of the fast clock that could occur during the OFF phase of the slow clock, n is an integer offset so that OFF-n is alternate number of half cycles that could occur during the OFF phase of the slow clock.

This second example assertion states at the time the OFF status register 912 value falls (i.e. goes from having a high value to a low value indicating the end of the OFF phase) the value of the sixth register 948 (i.e. the total half cycle count during the OFF phase) should be equal to OFF or OFF-n.

It will be evident to a person of skill in the art that these are examples only and other suitable assertions may be used.

Because the system 900 of FIG. 9, like the system 700 of FIG. 7, is based on a simple concept of counting using basic logic it allows a derived clock to be verified in a simple manner with minimal logic. In particular, the system 900 requires only two logic modules, two registers, six state machines and two assertions. As shown above, this can be implemented using very few lines of code. This is in contrast to simulation-based verification which is a tedious process that requires quite extensive and complicated code.

Furthermore, the system 900 is very adaptable. In particular, the aspects of the system can be written or defined so that they can be used to verify any derived clock that meets certain requirements (e.g. has an integer relationship with a half cycle of the main or reference clock). For example, the ON and OFF (and any n) values can be obtained from a configuration file at test time which can be used to create an instance of the system 900 for each derived clock-reference clock pair in the design. Accordingly, the same code can be used to test clocks with variable or fixed duty cycles and clocks with a variety of different duty cycles. This is in stark contrast to simulation-based verification which requires specific stimuli to be generated for each derived clock-reference clock pair.

The system 900 is also very portable. In particular once the system 900 is linked to the derived and reference clocks (e.g. first/fast and second/slow clocks) via binding, for example, the system 900 can be used to verify the clock regardless of last minute changes made to the clock (e.g. re-wiring of the clock). This is again in contrast to simulation-based verification. In particular, while it may be easy to re-wire the code for a clock to meet new requirements, re-verifying such as change required re-testing the new design with a new set of test vectors and simulations which is not only practically difficult, but can cause a significant delay to the delivery of the final product and may reduce the quality of the verification.

The system 900, due to its simplicity, also reduces the amount of time the test system can be brought online in contrast to simulation-based verification such as UVM (Universal Verification Methodology).

It will be evident to a person of skill in the art that although the state machines are described as being separate and distinct entities in other cases the functionality of more than one state machine (as described above) may be performed by a single state machine.

Figure 10:
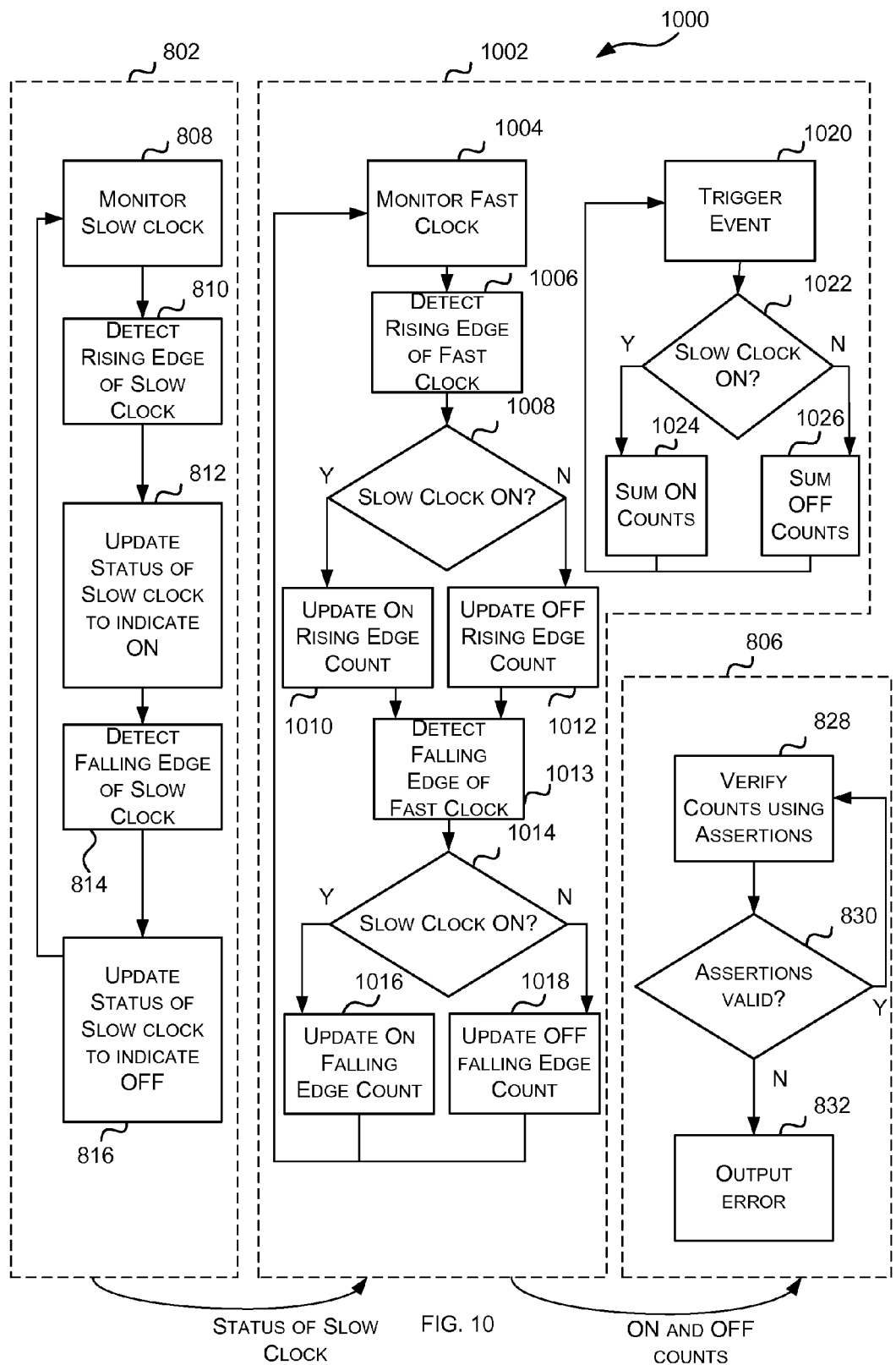
FIG. 10 is a flow diagram of an example method for verifying a derived clock signal using assertion-based verification that comprises counting the number of half clock cycles of the fast clock.

Reference is now made to FIG. 10 which illustrates an example method 1000 for verifying a derived clock using the system 900 of FIG. 9. The method 1000 counts the number of half cycles of the first or fast clock that occur between edges of the second or slow clock. The method 1000 comprises three processes 802, 1002 and 806 which may be executed in parallel. The first process 802 monitors the slow clock and updates the status of the slow clock to indicate whether the slow clock is in the ON phase or the OFF phase. The second process 1002 monitors the fast clock and updates one or more state machines based on the status of the slow clock to count the number of half cycles of the fast clock that occur during the ON and OFF phases of the slow clock. The third process 806 periodically checks the state machine output using assertions to verify the operation of the derived clock with respect to the reference clock.

The first and third processes 802 and 806 are the same as the first and third processes 802 and 806 described with reference to FIG. 8.

In the second process 1002, the first or fast clock is monitored 1004 until a rising edge of the first or fast clock has been detected 1006. Once the rising edge of the fast clock has been detected, it is determined using the status information generated by the first process 802 whether the slow clock is in the ON phase 1008. If the slow clock is in the ON phase then an ON rising edge counter (e.g. register 928) is updated or incremented 1010. If the slow clock is not in the ON phase then an OFF rising edge counter (e.g. register 944) is updated or incremented 1012.

Once the ON or OFF rising edge counter (e.g. register 928 or register 944) has been updated the system waits for the falling edge of the fast clock, once detected 1013, it is determined whether the slow clock is in the ON phase 1014. If the slow clock is in the ON phase then an ON falling edge counter (e.g. register 932) is updated or incremented 1016. If, however, the slow clock is not in the ON phase then an OFF falling edge counter (e.g. register 946) is updated or incremented 1018. Blocks 1004 to 1018 are then repeated.

Concurrently to counting the number of rising and falling edges in the ON and OFF phases of the slow clock blocks 1020 to 1026 are executed to sum the rising and falling edge counts in the ON and OFF phases to determine the total number of half cycles of the fast clock that occur during the ON and OFF phases of the slow clock. In particular, at block 1020 a trigger event occurs. As described above, the trigger event may be a change in the state of any of the signals in the system (e.g. fast clock, slow clock, register). Once a trigger event has occurred the status information generated by the first process 802 is used to determine whether the slow clock is in the ON phase 1022. If the slow clock is in the ON phase then the ON rising edge counter (e.g. register 928) is summed with the ON falling edge counter (e.g. register 932) to get a total count of the half cycles of the fast clock that occurred during the ON phase of the slow clock 1024. If the slow clock is not in the ON phase (i.e. it is in the OFF phase) then the OFF rising edge counter (e.g. register 944) is summed with the OFF falling edge counter (e.g. register 946) to get a total count of the half cycles of the fast clock that occurred during the OFF phase of the slow clock 1026.

Figure 11:
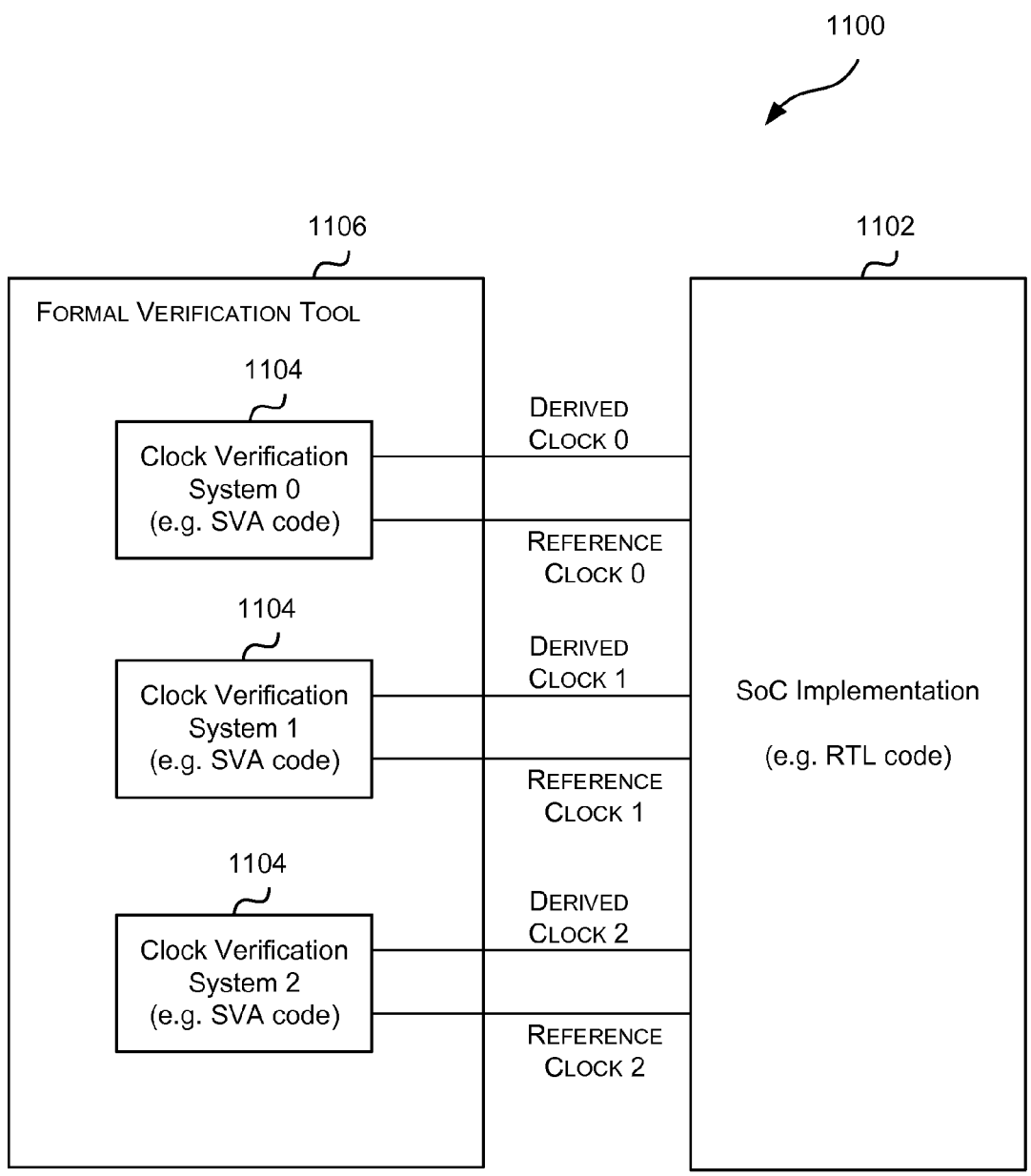
FIG. 11 is a block diagram of a system for verifying the derived clock signals of a hardware design using the system of FIG. 7 or FIG. 9.
Figure 12:
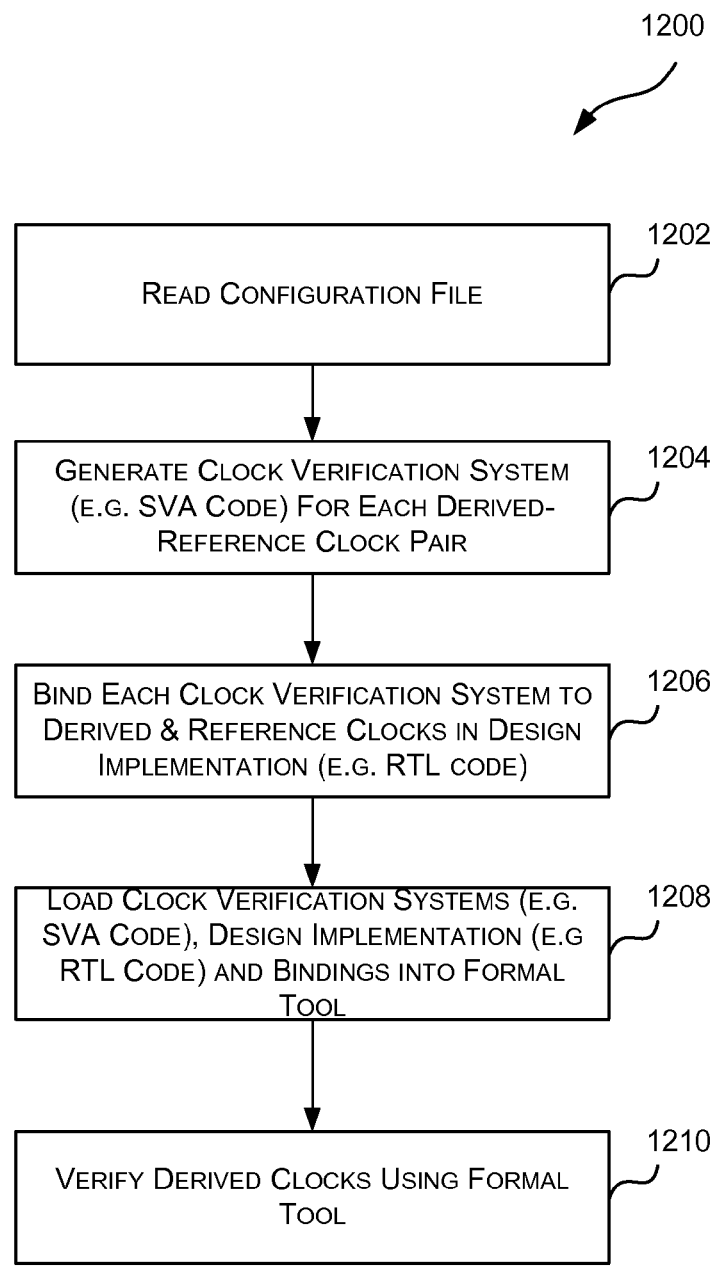
FIG. 12 is a flow diagram of an example method for verifying the derived clock signals of a hardware design using the system of FIG. 11.

Reference is now made to FIGS. 11 and 12 which illustrate how the clock verification systems 700 and 900 of FIGS. 7 and 9 may be used in formal verification to verify one or more derived clocks in a hardware design (e.g. SoC design). In particular, FIG. 11 illustrates an example formal verification test system 1100 and FIG. 12 illustrates a flow chart of a method 1200 for implementing the test system 1100. At block 1202 a configuration file (e.g. the specification) is read which identifies each derived clock-reference clock pair in the design implementation 1102 and specifies the parameter values (e.g. RATIO1/RATIO2 or ON/OFF (and any n)) for each pair. For each derived clock-reference clock pair identified in the configuration file an instance 1104 of the clock verification system 700 or 900 is generated at block 1204. For example, where the clock verification system 700 or 900 is implemented in SV, an SV instance 1104 of the clock verification system (logic, registers, state machines and assertions) is created for each derived clock-reference clock pair using the parameters specified in the configuration file.

Once an instance 1104 of the clock verification system 700 or 900 has been created for each derived clock-reference clock pair, at block 1206 each instance 1104 is bound to the corresponding derived clock and reference clock of the design implementation 1102. For example, where the design is implemented in RTL and the clock verification system is implemented in SV, each SV instance is bound to the corresponding derived clock and reference clock in the RTL code.

Once each clock verification system (e.g. SV instance) has been bound to the design implementation (e.g. RTL code), at block 1208 the clock verification systems (e.g. SV code), design implementation (e.g. RTL code) and bindings are loaded into a formal verification tool 1106, such as, but not limited to, Cadence™ IEV, Jasper™'s Jasper Gold™, and OneSpin™ to establish the test environment.

Figure 13:
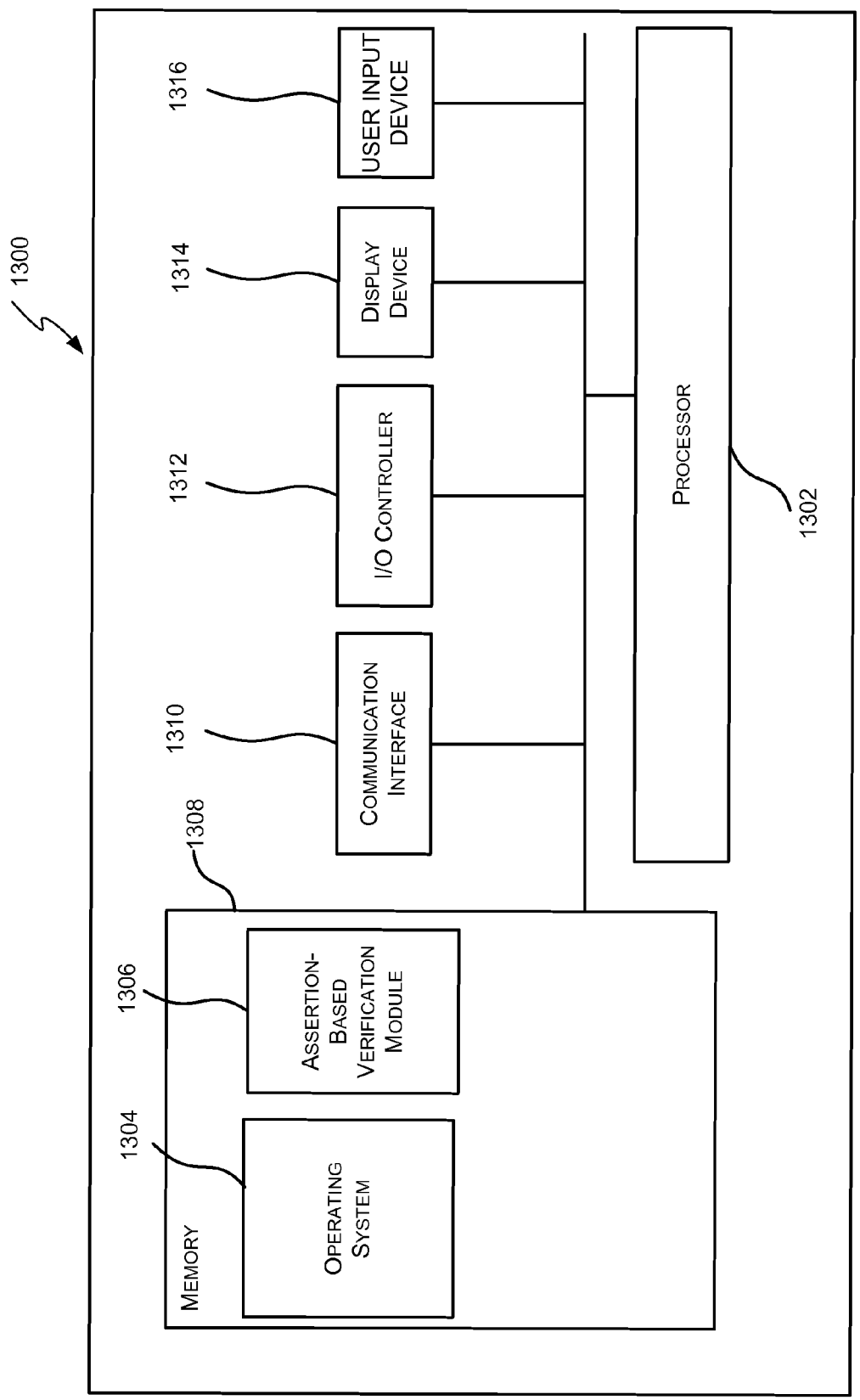
FIG. 13 is a block diagram of an example computing-based device.

At block 1210 the formal verification tool 1106 is then used to verify the derived clocks in the design implementation (e.g. RTL code) using the defined assertions, FIG. 13 illustrates various components of an exemplary computing-based device 1300 which may be implemented as any form of a computing and/or electronic device, and in which embodiments of the systems and methods described above for verifying a derived clock using assertion-based verification may be implemented.

Computing-based device 1300 comprises one or more processors 1302 which may be microprocessors, controllers or any other suitable type of processors for processing computer executable instructions to control the operation of the device in order to verify a derived clock using assertion-based verification. In some examples, for example where a system on a chip architecture is used, the processors 1302 may include one or more fixed function blocks (also referred to as accelerators) which implement a part of the method of verifying a derived clock using assertion-based verification in hardware (rather than software or firmware). Platform software comprising an operating system 1304 or any other suitable platform software may be provided at the computing-based device to enable application software 1306, such as assertion-based verification software to be executed on the device.

The computer executable instructions may be provided using any computer-readable media that is accessible by computing based device 1300. Computer-readable media may include, for example, computer storage media such as memory 1308 and communications media. Computer storage media (i.e. non-transitory machine readable media), such as memory 1308, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (i.e. non-transitory machine readable media, e.g. memory 1308) is shown within the computing-based device 1300 it will be appreciated that the storage may be distributed or located remotely and accessed via a network or other communication link (e.g. using communication interface 1310).

The computing-based device 1300 also comprises an input/output controller 1312 arranged to output display information to a display device 1314 which may be separate from or integral to the computing-based device 1300. The display information may provide a graphical user interface. The input/output controller 1312 is also arranged to receive and process input from one or more devices, such as a user input device 1316 (e.g. a mouse or a keyboard). This user input may be used to control the operation of the verification of the derived clock. In an embodiment the display device 1314 may also act as the user input device 1316 if it is a touch sensitive display device. The input/output controller 1312 may also output data to devices other than the display device, e.g. a locally connected printing device (not shown in FIG. 13).

The term 'processor' and 'computer' are used herein to refer to any device, or portion thereof, with processing capability such that it can execute instructions. The term 'processor' may, for example, include central processing units (CPUs), graphics processing units (GPUs or VPUs), physics processing units (PPUs), digital signal processors (DSPs), general purpose processors (e.g. a general purpose GPU), microprocessors, any processing unit which is designed to accelerate tasks outside of a CPU, etc. Those skilled in the art will realize that such processing capabilities are incorporated into many different devices and therefore the term 'computer' includes set top boxes, media players, digital radios, PCs, servers, mobile telephones, personal digital assistants and many other devices.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the spirit or scope of this invention.

The invention claimed is:

1. A method of verifying a function of a derived clock signal in an integrated circuit hardware design, the derived clock signal being derived in the hardware design from a reference clock signal to have a particular duty cycle and period, the method comprising:

counting, by at least one first state machine, a number of full or half cycles of a first clock signal that occur between a rising edge and a falling edge of a second clock signal, the second clock signal operating at a lower frequency than the first clock signal, wherein the faster of the reference clock signal and the derived clock signal is designated as the first clock signal, and the slower of the reference clock signal and the derived clock signal is designated as the second clock signal;

counting, by at least one second state machine, a number of full or half cycles of the first clock signal that occur between a falling edge and a rising edge of the second clock signal;

receiving counts from said at least one first and second state machines;

verifying the duty cycle and the period of the derived clock signal by evaluating one or more assertions written in an assertion-based language that compare the received counts from said at least one first and second state machines to one or more predetermined numbers; and manufacturing an integrated circuit in accordance with the integrated circuit hardware design having the verified function.

2. The method of claim 1, wherein counting the number of full cycles of the first clock signal that occur between two edges of the second clock signal comprises counting the number of rising edges of the first clock signal that occur between the two edges of the second clock signal.

3. The method of claim 1, wherein counting the number of half cycles of the first clock signal that occur between two edges of the second clock signal comprises:

counting the number of rising edges of the first clock signal that occur between the two edges of the second clock signal;

counting the number of falling edges of the first clock signal that occur between the two edges of the second clock signal; and summing the number of rising edges and the number of falling edges to produce the number of half cycles of the first clock signal that occur between the two edges of the second clock signal.

4. The method of claim 1, wherein the one or more assertions comprise an assertion that when the second clock signal falls from a high value to a low value the count of half cycles or full cycles of the first clock signal that occur between the rising edge and falling edge of the second clock signal is equal to one of the one or more predetermined numbers.

5. The method of claim 1, wherein the one or more assertions comprise an assertion that when the second clock signal rises from a low value to a high value the count of half cycles or full cycles of the first clock signal that occur between the falling edge and the rising edge of the second clock signal is equal to one of the one or more predetermined numbers.

6. The method of claim 1, wherein the first clock signal is derived from the second clock signal through multiplication.

7. The method of claim 1, wherein the second clock signal is derived from the first clock signal through division.

8. The method of claim 1, wherein at least one of the first clock signal and the second clock signal has a variable duty cycle.

9. A system to verify a function of a derived clock signal in an integrated circuit hardware design, the derived clock signal being derived in the hardware design from a reference clock signal to have a particular duty cycle and period, the system comprising:

at least one first state machine configured to count a number of full or half cycles of a first clock signal that occur between a rising edge and a falling edge of a second clock signal, the second clock signal operating at a lower frequency than the first clock signal, wherein the faster of the reference clock signal and the derived clock signal is designated as the first clock signal, and the slower of the reference clock signal and the derived clock signal is designated as the second clock signal;

at least one second state machine configured to count a number of full or half cycles of the first clock signal that occur between a falling edge and a rising edge of the second clock signal; and an assertion verification unit configured to verify the duty cycle and period of the derived clock signal by evaluating one or more assertions written in an assertion-based language that compare the counts from said at least one first and second state machines to one or more predetermined numbers;

wherein the system is configured to implement a manufacturing process to manufacture an integrated circuit in accordance with the integrated circuit hardware design having the verified function.

10. The system of claim 9, wherein the at least one first state machine comprises a state machine configured to count the number of rising edges of the first clock signal that occur between the rising edge and the falling edge of the second clock signal; and the at least one second state machine comprises a state machine configured to count the number of rising edges of the first clock signal that occur between the falling edge and the rising edge of the second clock signal.

11. The system of claim 10, wherein the at least one first state machine further comprises another state machine configured to count the number of falling edges of the first clock signal that occur between the rising edge and the falling edge of the second clock signal, and a further state machine configured to sum the number of rising edges and falling edges of the first clock signal that occur between the rising edge and the falling edge of the second clock signal to produce the number of half cycles of the first clock signal that occur between the rising edge and the falling edge of the second clock signal; and the at least one second state machine further comprises another state machine configured to count the number of falling edges of the first clock signal that occur between the falling edge and the rising edge of the second clock signal, and a further state machine configured to sum the number of rising edges and falling edges of the first clock signal that occur between the falling edge and the rising edge of the second clock signal to produce the number of half cycles of the first clock signal that occur between the falling edge and the rising edge of the second clock signal.

12. The system of claim 9, wherein the one or more assertions comprises two assertions written in an assertion-based language.

13. The system of claim 9, wherein the one or more assertions comprise an assertion that when the second clock signal falls from a high value to a low value the count of half cycles or full cycles of the first clock signal that occur between the rising edge and falling edge of the second clock signal is equal to one of the one or more predetermined numbers.

14. The system of claim 9, wherein the one or more assertions comprise an assertion that when the second clock signal rises from a low value to a high value the count of half cycles or full cycles of the first clock signal that occur between the falling edge and the rising edge of the second clock signal is equal to one of the one or more predetermined numbers.

15. The system of claim 9, wherein the first clock signal is derived from the second clock signal through multiplication.

16. The system of claim 9, wherein the second clock signal is derived from the first clock signal through division.

17. The system of claim 9, wherein at least one of the first clock signal and the second clock signal has a variable duty cycle.

18. A non-transitory computer readable storage medium having stored thereon computer executable program code that when executed causes at least one processor to verify a function of a derived clock signal in an integrated circuit hardware design, by:

counting, using at least one first state machine, a number of full or half cycles of a first clock signal that occur between a rising edge and a falling edge of a second clock signal, the second clock signal operating at a lower frequency than the first clock signal, wherein the faster of a reference clock signal and a derived clock signal that is derived in a hardware design from the reference clock signal is designated as the first clock signal, and the slower of the reference clock signal and the derived clock signal is designated as the second clock signal;

counting, using at least one second state machine, a number of full or half cycles of the first clock signal that occur between a falling edge and a rising edge of the second clock signal; and verifying a duty cycle and period of the derived clock signal by evaluating one or more assertions written in an assertion-based language that compare the counts from said at least one first and second state machines to one or more predetermined numbers; wherein an integrated circuit is manufactured in accordance with the integrated circuit hardware design having the verified function.

* * * * *